United States Patent

Koike et al.

[11] Patent Number: 5,730,243
[45] Date of Patent: Mar. 24, 1998

[54] ASSIST DEVICE FOR USE IN ELECTRIC VEHICLES

[75] Inventors: Yoshikazu Koike; Minoru Kozaki; Kunihiko Takagi, all of Suwa; Kohichi Tadokoro, Tokyo, all of Japan

[73] Assignee: Seiko Epson Corporation, Tokyo, Japan

[21] Appl. No.: 594,028

[22] Filed: Jan. 30, 1996

[30] Foreign Application Priority Data

Jan. 30, 1996 [JP] Japan .................... 7-012272

[51] Int. Cl.$^6$ .................................. B60K 28/04
[52] U.S. Cl. ................ 180/220; 180/273; 180/170
[58] Field of Search ....................... 180/219, 220, 180/271, 272, 273, 65.8, 170, 171

[56] References Cited

U.S. PATENT DOCUMENTS 5,109,945  5/1992  Koga ............................. 180/273
5,610,814  3/1997  Sugioka et al. ............... 180/273 X

*Primary Examiner*—Kevin Hurley
*Attorney, Agent, or Firm*—Mark P. Watson

[57] ABSTRACT

An assist device for use in an electric vehicle capable of allowing a driver to walk the electric vehicle in power assistance at an extremely slow speed, preventing a sudden start of the vehicle, allowing the driver to monitor an insufficient capacity of a storage battery even with the main switch of the vehicle turned off, and determining an accurate charge capacity by eliminating the surface charge state of the storage battery when a charging operation ends. According to the present invention, firstly, the running motor of the vehicle is shifted to an extremely slow speed mode when the driver's dismounting is sensed and when the closed state of an accelerator is sensed. Secondly, a sudden start is prevented when the main switch is turned on with the accelerator opened. Thirdly, the reverse rotary motion of the running motor is transmitted to a stand mechanism via a one-way clutch. Fourthly, the operation of both a remaining capacity meter and insufficient capacity alarm means are continuously operated for a predetermined of time after turn-off of the main switch by means of timer means that is activated by the turn-off of the main switch when the storage battery suffers an insufficient capacity. Fifthly, the capacity of the storage battery is determined after the surface charge of the storage battery is eliminated when a charging operation is complete.

11 Claims, 11 Drawing Sheets

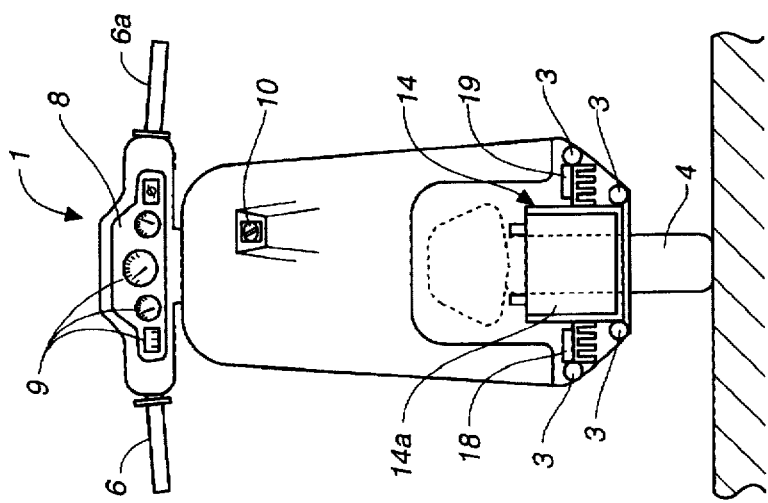
FIG._2
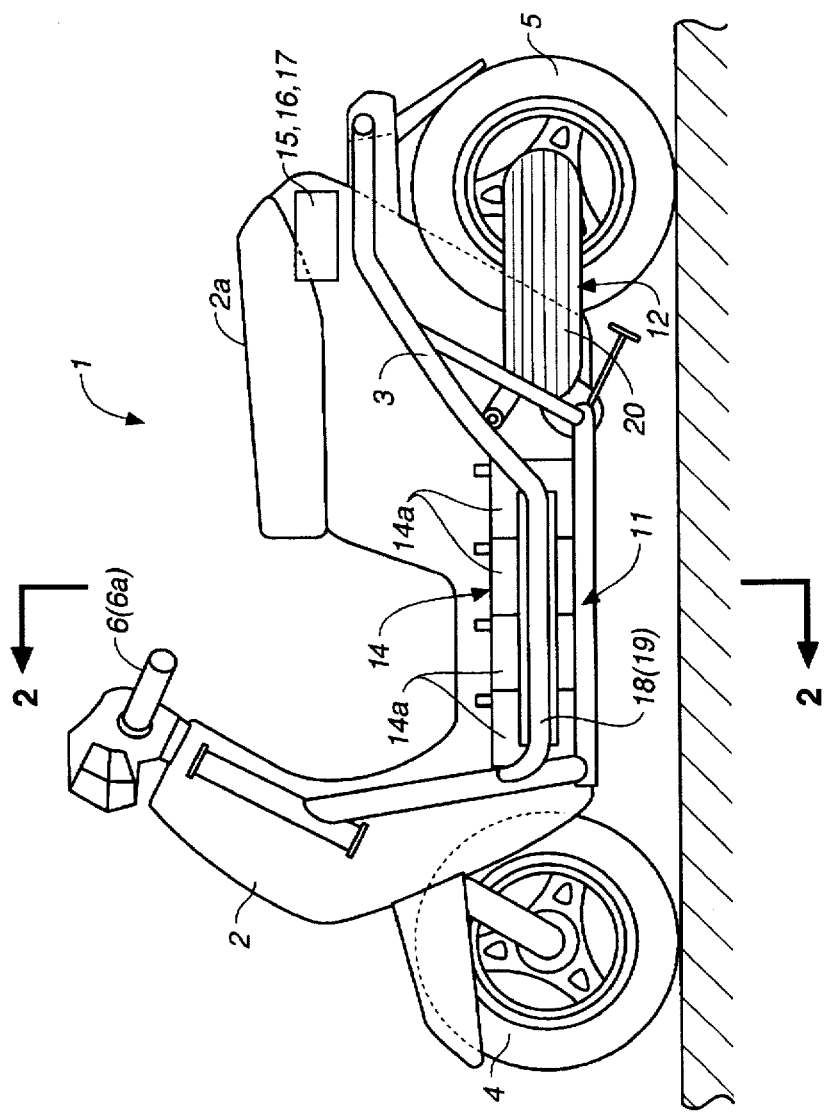
FIG._1

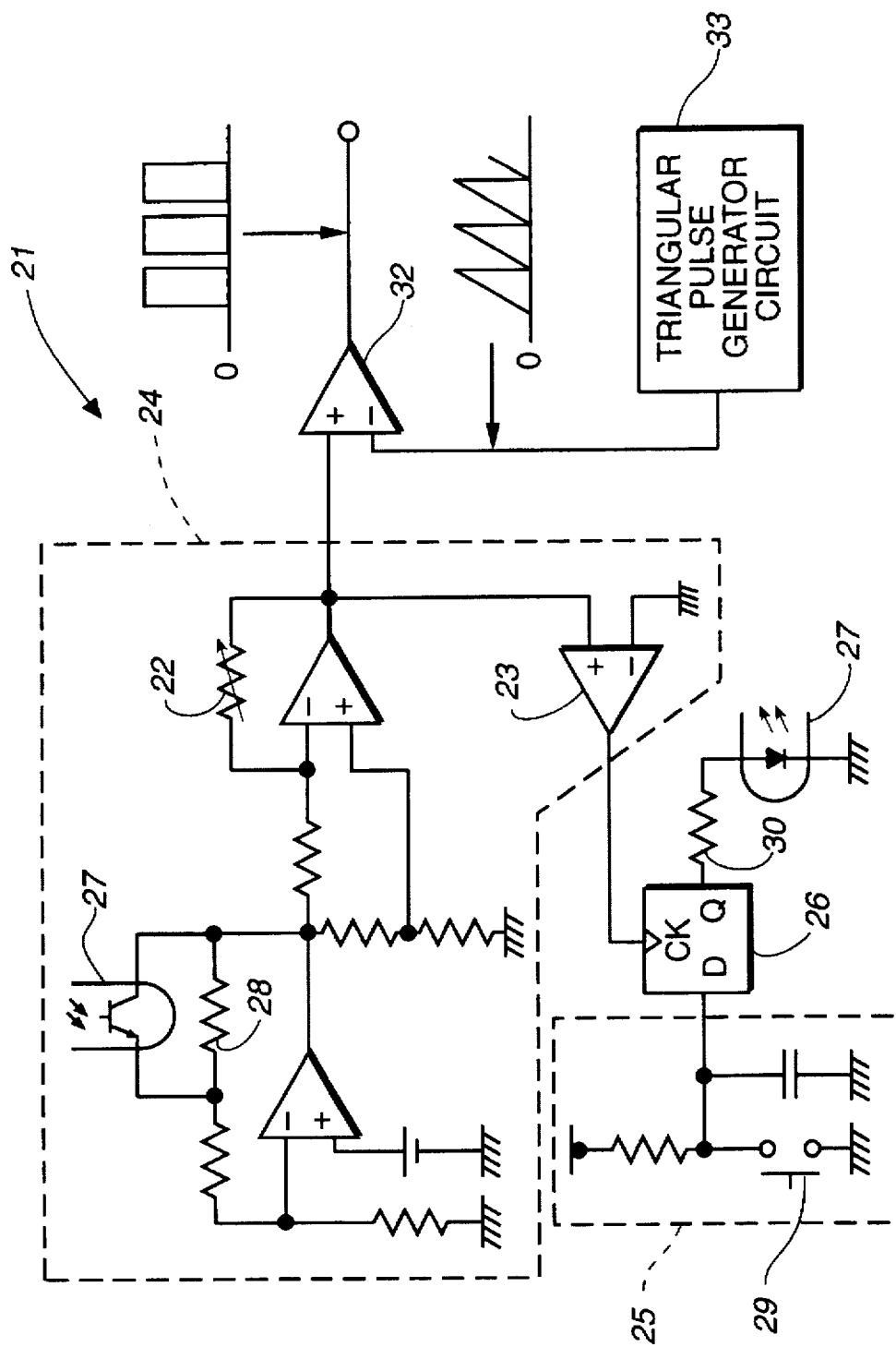
FIG._3

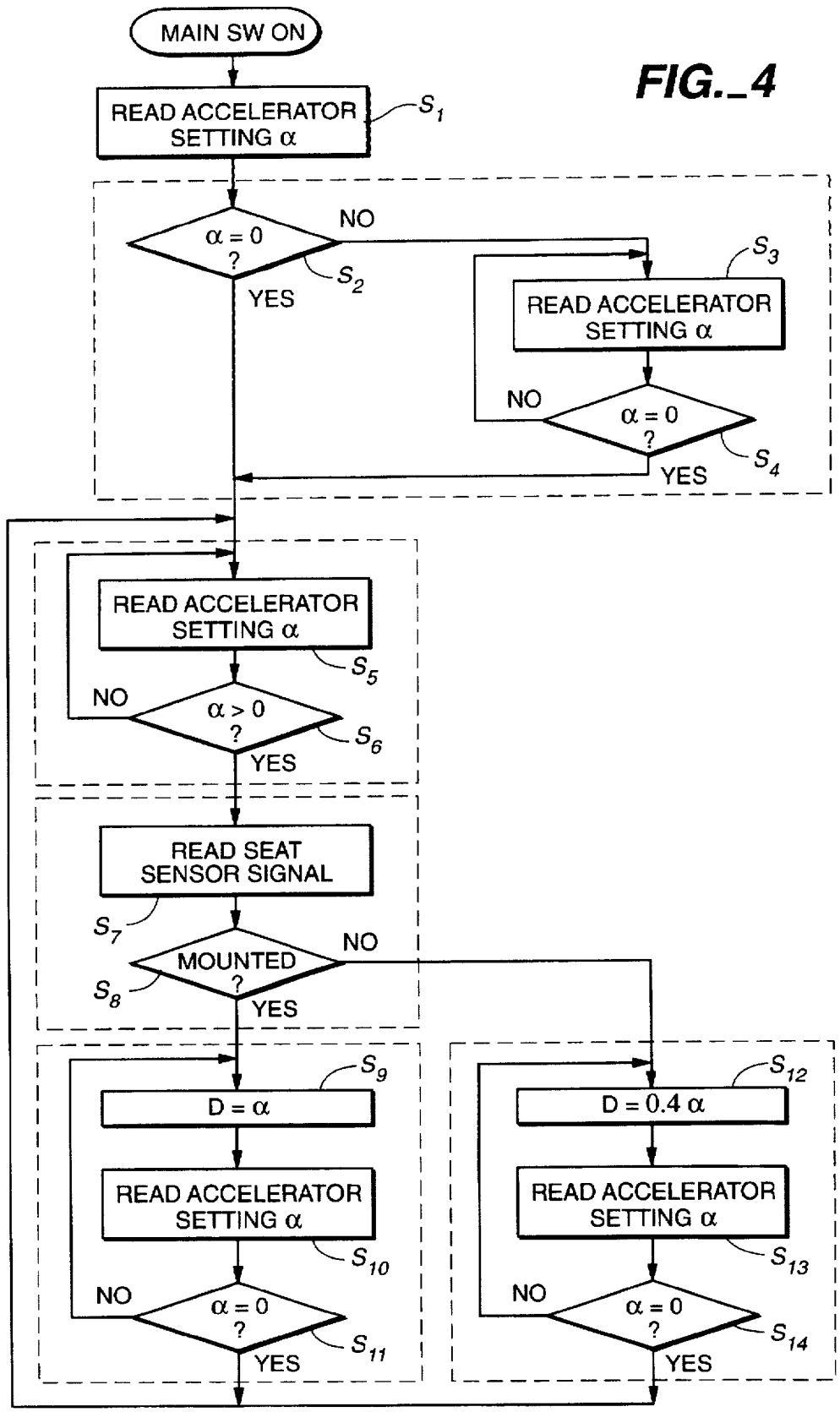
FIG._4

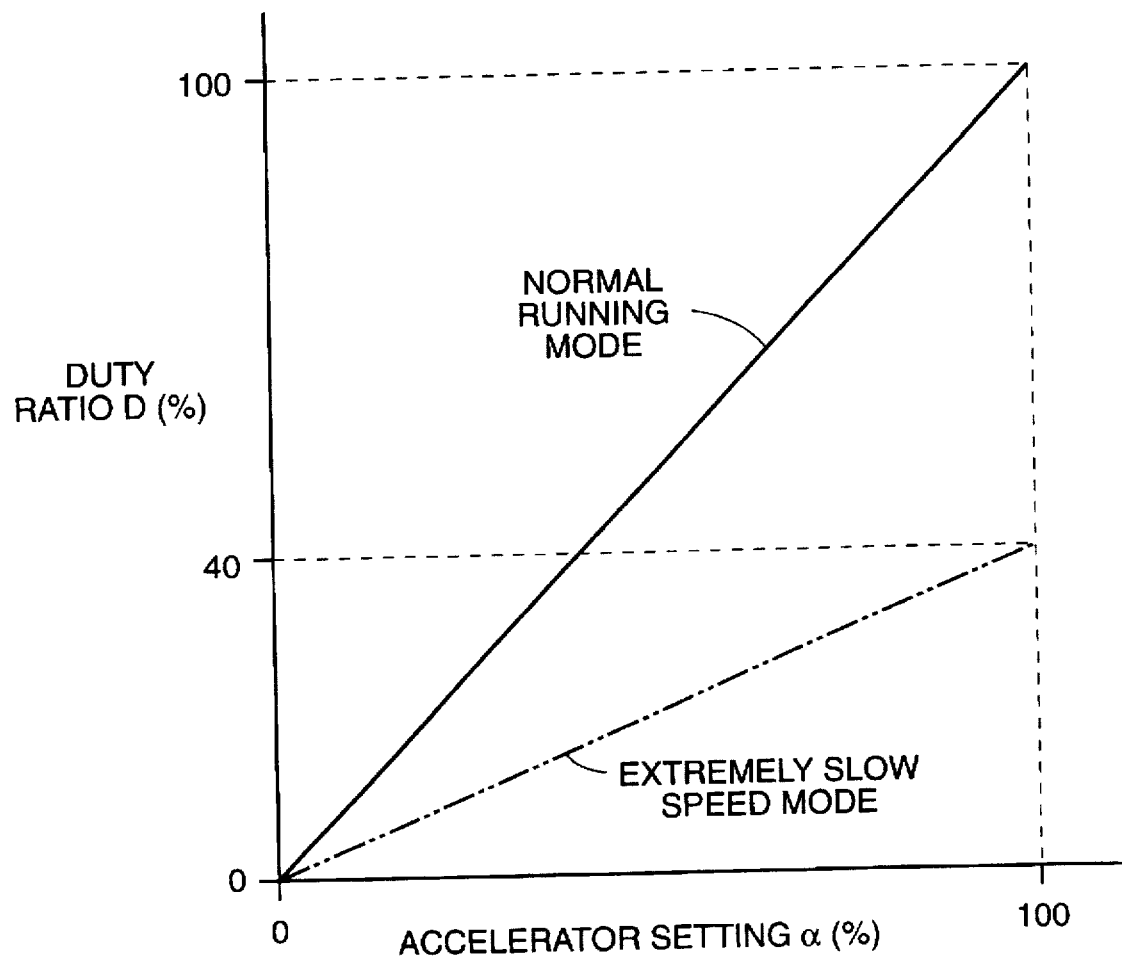
FIG._5

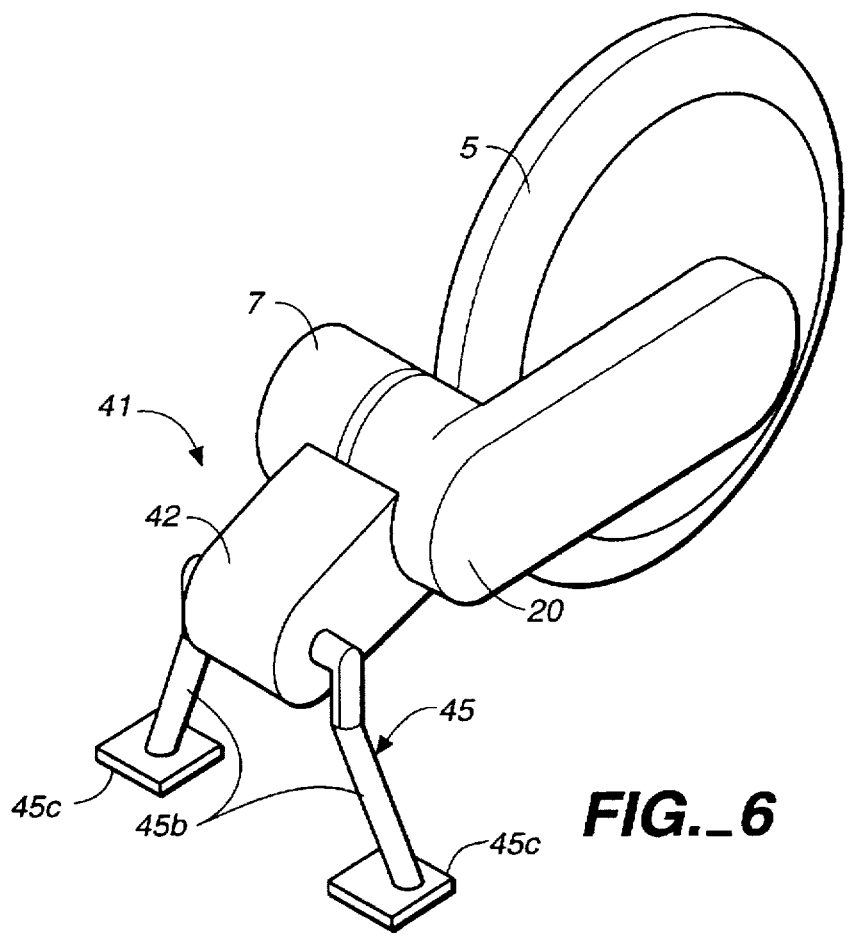
FIG._6
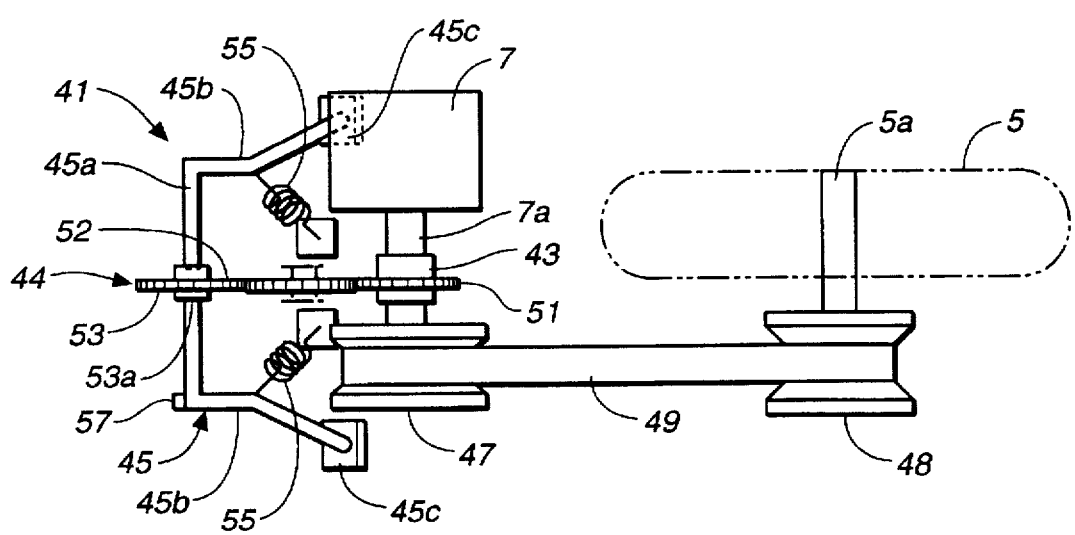
FIG._7

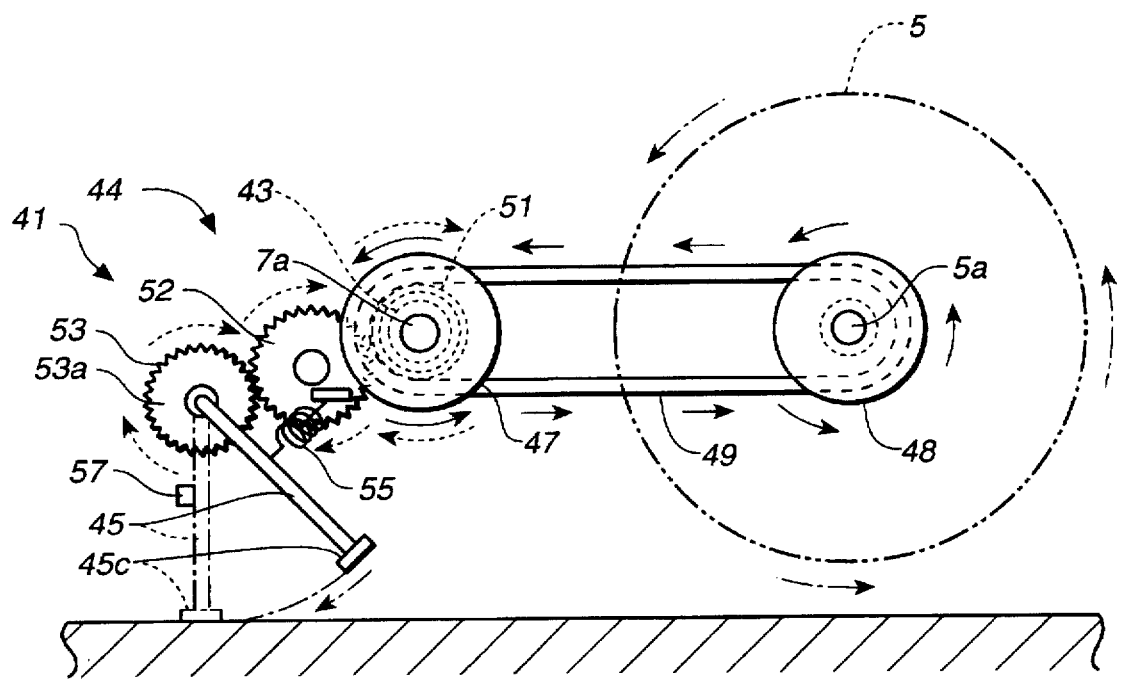
FIG._8
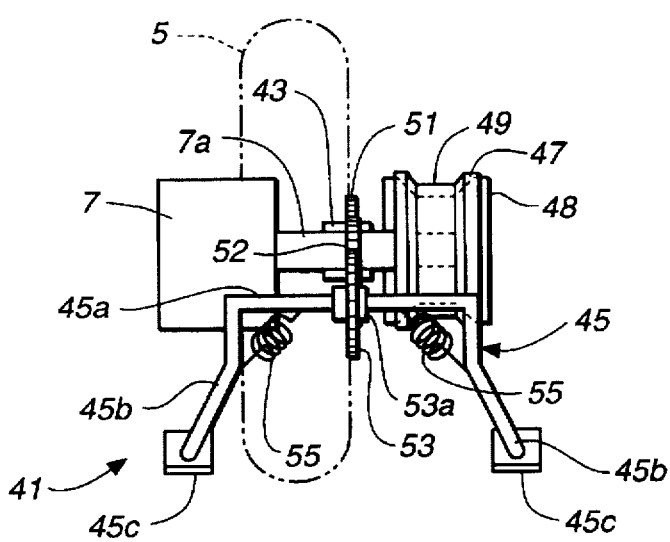
FIG._9

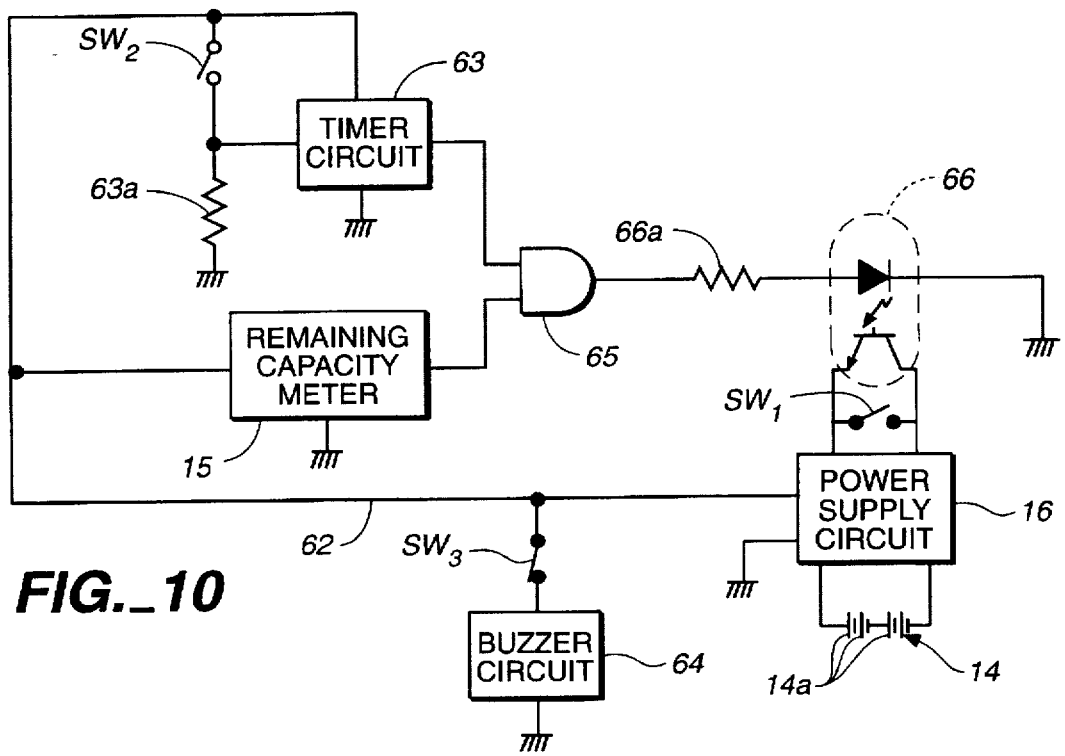
FIG._10
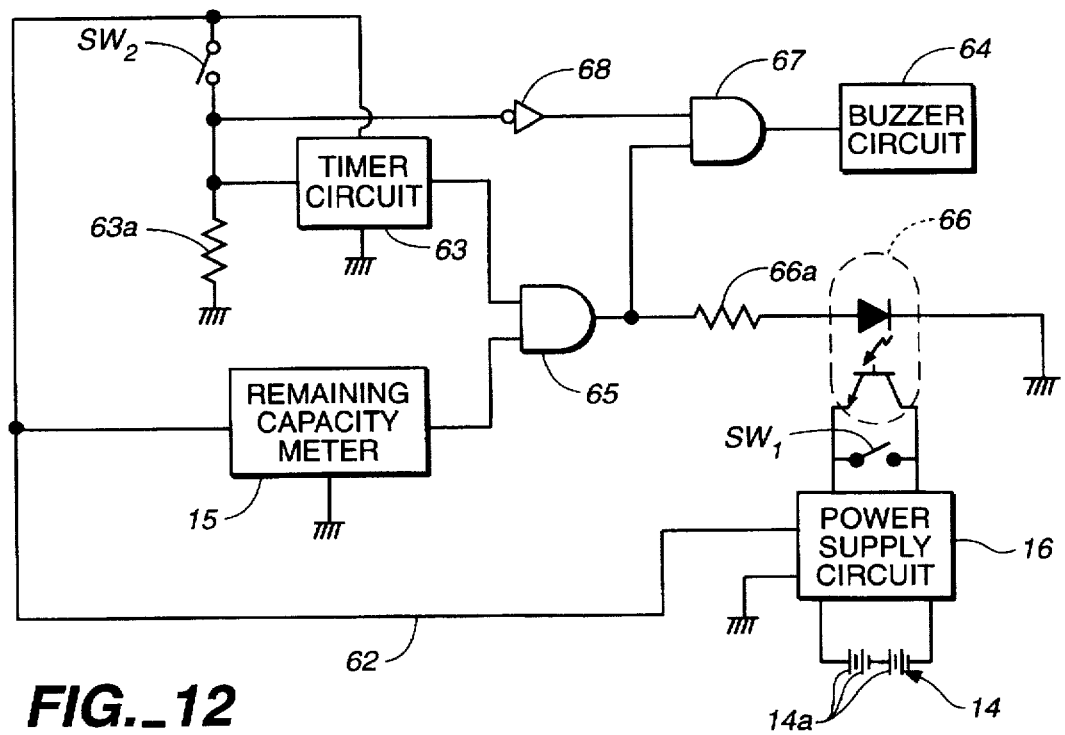
FIG._12

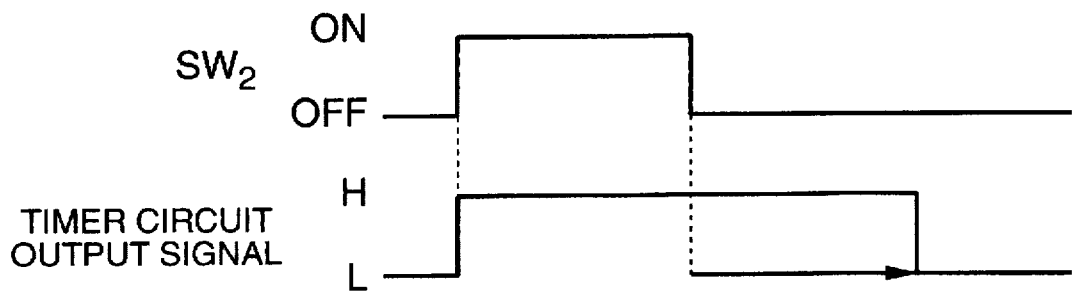
FIG._11A
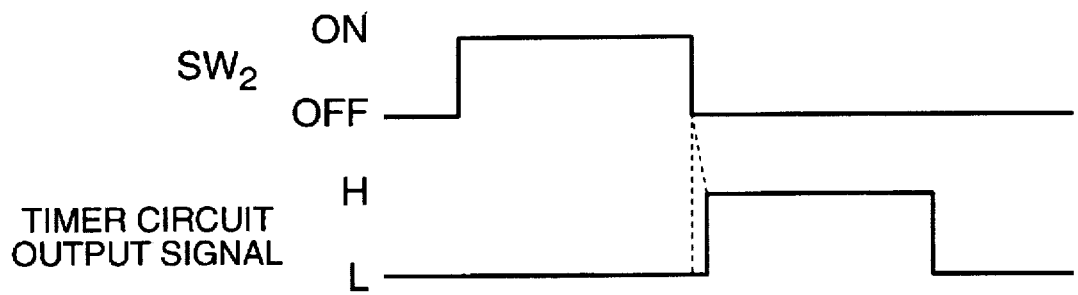
FIG._11B
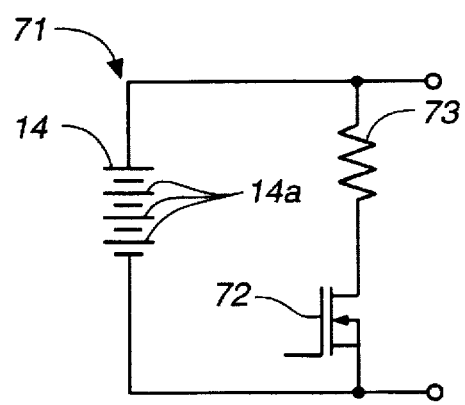
FIG._14

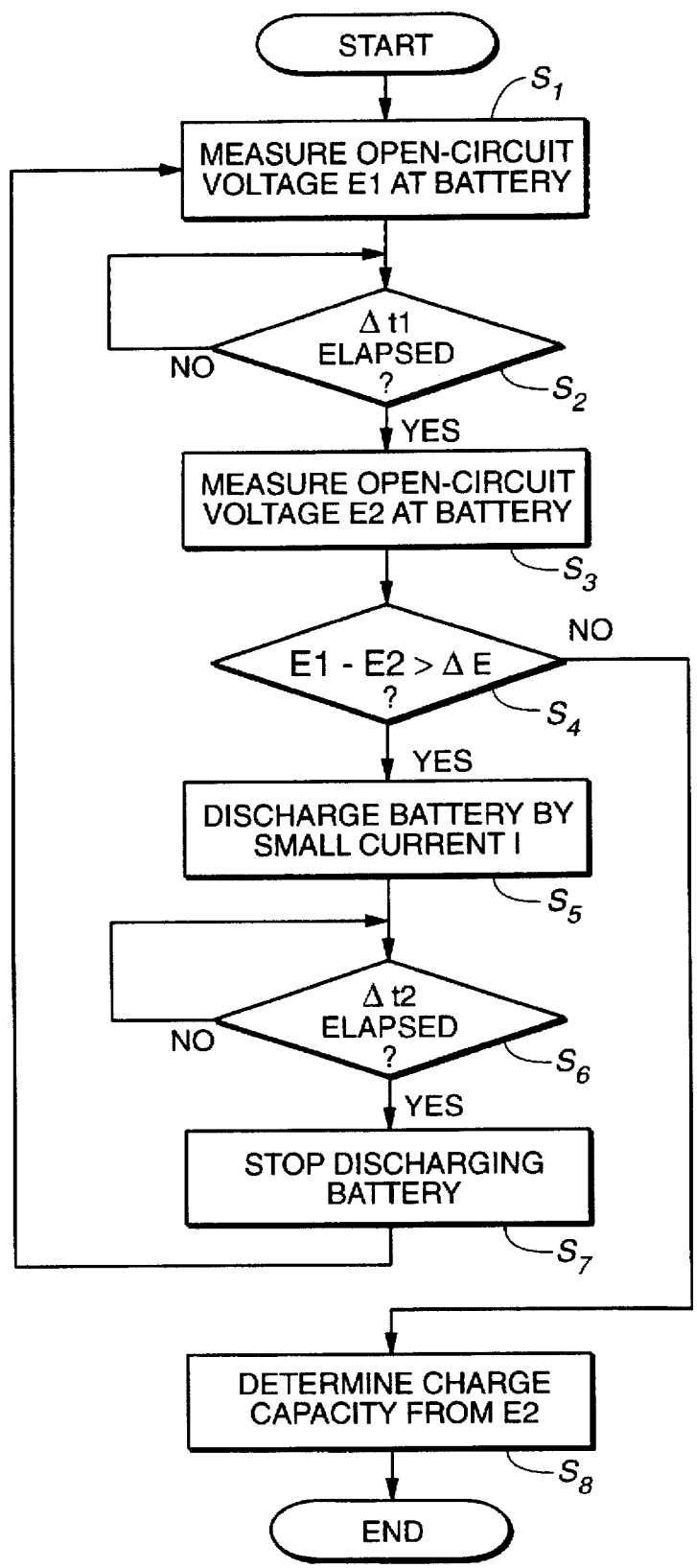
FIG._13

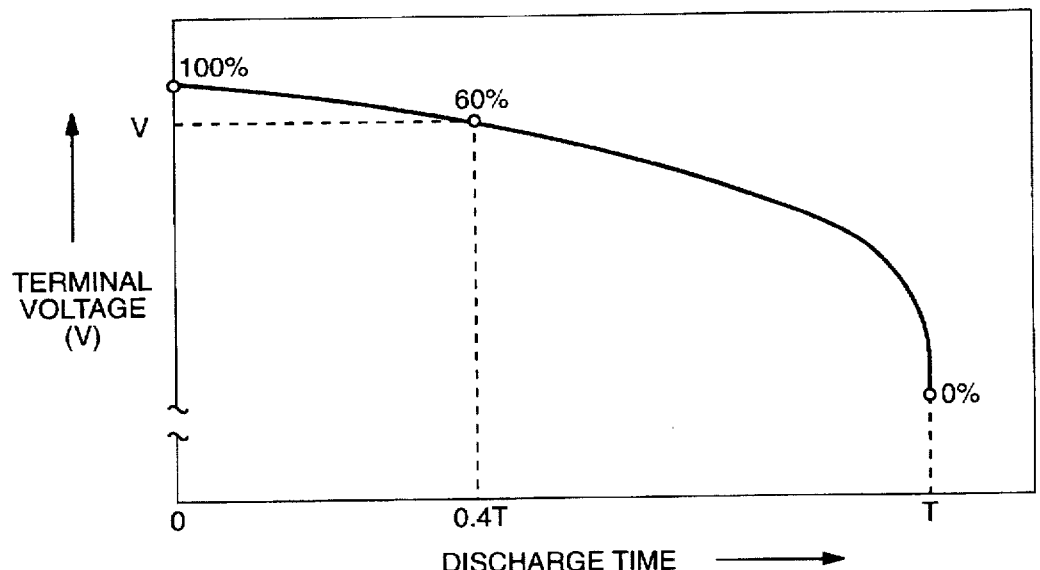
FIG._15
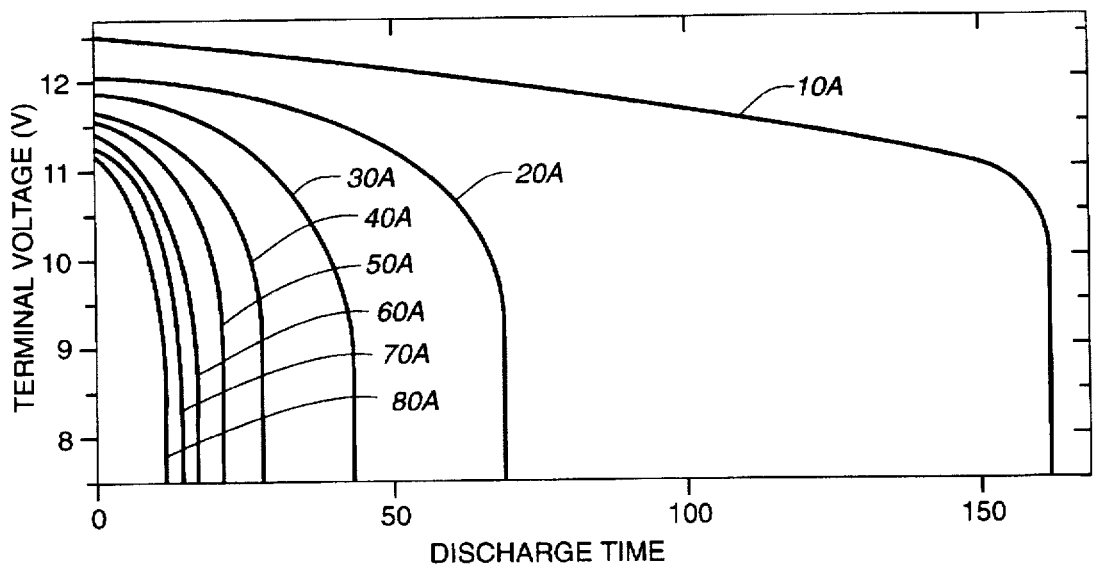
FIG._16

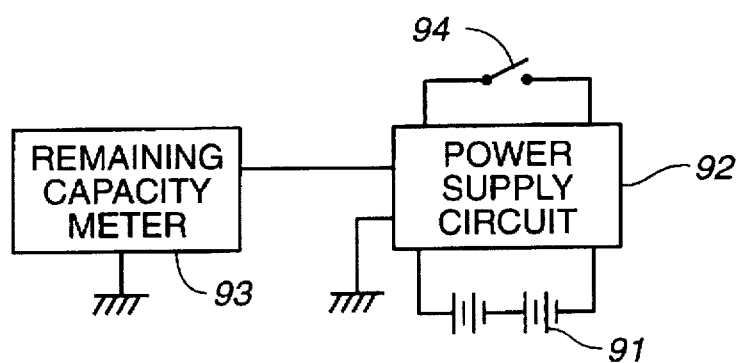
FIG._17
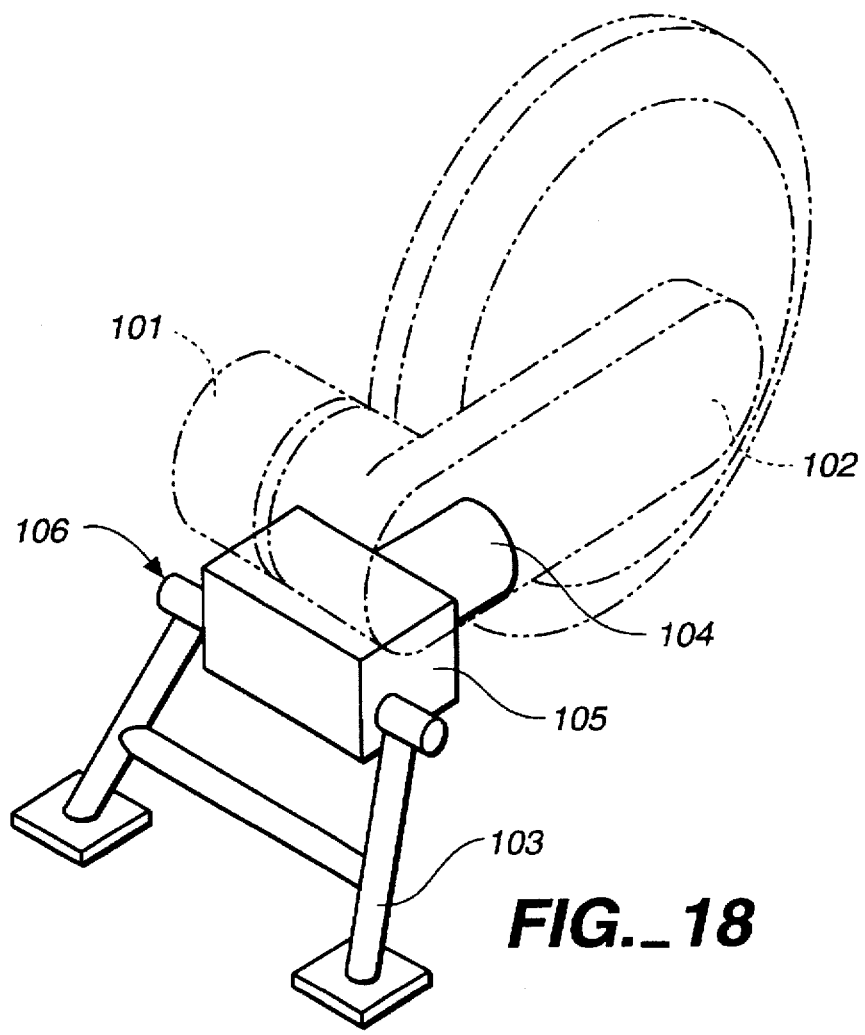
FIG._18

ASSIST DEVICE FOR USE IN ELECTRIC VEHICLES

BACKGROUND OF THE INVENTION

1. Field of the Invention

This invention relates generally to an assist device for use in an electric vehicle and, in particular, to the assist device that provides a wide range of ease-of-use design improvements in the electric vehicle.

2. Description of the Related Art

Electric vehicles that use an electric motor as a prime mover recently draw attention as a next generation vehicle that is expected to replace a gasoline-powered vehicle employing an internal combustion engine. A diversity of technical proposals have been made in connection with the electric vehicle. The electric vehicle using environmentally clean electrical energy solves entirely environmental problems associated with internal combustion engines, such as emissions of toxic exhaust gases and noise. It is estimated that 70% of air pollutants is given off by internal combustion engines. Also, it is believed that the full-scale introduction of electric vehicles effectively slows the current consumption rate of fossil fuels such as petroleum effectively doubling the currently expected remaining availability period of fossil fuels.

As in the gasoline-powered vehicle, the electric vehicle is provided with running wheels suspended at shock absorbers by the vehicle body. The running wheels are driven by a power transmission device, the power source of which is an electric motor. The electric motor is power supplied by an electric power device. The electric power device is made up of a battery bank section having a plurality of storage batteries, a power supply circuit section for supplying electric power in a reliable manner, an electric motor for driving, a motor driving circuit, and a control circuit for issuing speed instructions or the like to the motor driving circuit. Driving power generated by the motor is then transmitted via the power transmission device to the running wheels to allow the electric vehicle to run.

The battery bank section that feeds electric power to the running motor is constructed of the plurality of storage batteries connected in series to obtain a required voltage. The storage batteries have the following characteristics: the voltage across the battery terminals gradually drops with time elapse when the battery is used or discharged, as plotted by a discharge curve in FIG. 15. As soon as the battery voltage reaches a termination voltage at the rightmost end of the curve in FIG. 15, discharge is terminated to protect the storage battery. As FIG. 16 illustrates, the storage battery follows different discharge curves depending on the current in use. It is known that the operating discharge time of the battery varies as its operating current varies. For this reason, the electric vehicle is provided with a meter, indicative of power remaining unused, employing a diversity of techniques, to correctly know electrical energy remaining unused in the storage battery. The remaining capacity meter estimates electric power remaining and indicates it to a driver.

As shown in FIG. 17, electric power from a battery bank section 91 is voltage-regulated by a power supply circuit section 92, and is distributed via unshown power lines to a diversity of devices including a remaining capacity meter 93. The main switch 94 to be operated by the driver is connected to the power supply circuit section 92. By operating the main switch 94, the power supply circuit section 92 is switched on or off. When the vehicle comes to a complete halt to park it, the key switch 94 is switched off cutting battery power to all devices on board including the remaining capacity meter to stop the operation of each device. The main key is detached from its switch and kept in the hands of the driver to prevent the vehicle from being stolen. Electric power regulated by the power supply circuit section 92 is fed to the motor via the motor driving circuit. The motor driving circuit in its chopper controlling mode controls the speed of the motor by raising or lowering the supply voltage to the motor. The chopper control duty ratio that raises or lowers voltage is controlled by the control circuit. The control circuit is electrically connected to an accelerator grip. The control circuit sets a duty ratio in response to the driver's opening setting of the accelerator. In response to the duty factor, the motor driving circuit raises or lowers the RMS voltage fed to the motor. The speed of the motor according to the opening of the accelerator is thus obtained.

Since the electric vehicle does not have an idling state that is typical of the standard gasoline-powered vehicle, a ready-to-run state may go unnoticed. An erratic opening of the accelerator causes the vehicle to start running suddenly, while the driver is not ready to start in his driving position. A dismount sensor is disposed under a seat to sense the seating position of the driver. Even when a vehicle is ready to start, it gives off an alarm sound such as a buzzer sound in some known systems (for example, Japanese Patent Application No. Hei-6-115469). In another known system, a vehicle stops entirely the operation of the motor regardless of accelerator operation when a driver dismounts.

In an electric two-wheel vehicle such as a two-wheel motorcycle or scooter, a motorcycle stand having at least two feet is provided in the vicinity of its rear running wheel. When such a vehicle is parked, the stand is set to its parking position. During parking, the vehicle is balanced on three ground points: one at its front wheel and two at the stand's feet.

To charge a consumed storage battery, it is charged with a charging voltage that is typically higher than its nominal voltage. For example, for a 12 V storage battery, approximately 15 V is fed to the battery to charge it. The capacity of the battery is accurately determined based on the fact that the terminal voltage of the battery varies linearly with battery capacity when an open-circuit voltage is measured with the battery set for no load state upon completion of a charging operation.

When the charging operation is completed, however, the terminal voltage rises temporarily (this state is hereinafter referred to as "surface charge state") partly because the charging voltage is higher than the nominal voltage and partly because the battery interior remains electrochemically nonuniform at this moment. Terminal voltage measurement provides no accurate measurement of the battery capacity, therefore. For example, a 12 V storage battery is charged with a charging voltage of approximately 15 V. Immediately after the charging operation, the open-circuit voltage stays in the vicinity of 15 V regardless of actual capacity of the battery. Even when the charging operation is stopped before being fully charged, the battery may be mistakenly considered as fully charged because the measured terminal voltage is high. It is known that as time elapses, such a surface charge state indicating a high voltage is eliminated and the terminal voltage reaches to its equilibrium one reflecting actual charged battery capacity.

In one of known methods of determining charged battery capacity immediately after charging, a regression equation that relates elapsed time after the completion of charging to open-circuit voltage is determined, the regression equation is used to estimate the open-circuit voltage at the equilibrium state after a sufficient duration of time has elapsed, and charged capacity is then calculated from the estimated open-circuit voltage (for example, Japanese Patent Application Hei-4-363679).

In the electric two-wheel motorcycle such as a electric scooter, the ease of use as the motorcycle is greatly impaired by heavy weight, compared with an engine scooter. Namely, the electric scooter is relatively heavy because it has a number of batteries mounted on board. Heavy weight presents a handling difficulty to users.

When transferring the two-wheel motorcycle from its step position to its parking position in a parking lot, for example, or from its parking position to its start position, a driver usually dismounts and walks the two-wheel motorcycle there. The two-wheel motorcycle thus needs a great deal of human power. When walking the two-wheel motorcycle on a non-level road or a slope in particular, the driver has even more difficulty in this manual running operation. The running motor may be used to assist the driver in his manual running operation, but this may be very risky. An erratic accelerator manipulation may trigger a sudden start. From the safety standpoint, using the running motor for assistance is not preferable.

In the already cited known system that triggers an alarm sound to alert the driver, the alarm sound may go unnoticed depending the ambient conditions. In this case, stopping entirely the running motor is not perfectly acceptable, because it cannot be used to assist the driver in his manual run operation any more.

Furthermore, another difficulty a heavy vehicle presents is that the driver needs more power and skill in putting the scooter on its stand for parking. As shown in FIG. 18, a known system comprises a stand device 106 having a dedicated motor 104 and its gear box 105 to put a stand 103 in its upright position, besides a running motor 101 and a power transmission device 102. The dedicated motor 104 provides driving power to put the stand 103 in its upright position. This stand device 106 employing the dedicated motor, however, renders the design of the vehicle more complicated and heavier.

The main switch turns on or off the power supply circuit that feeds power to all on-board devices in need. When the main switch is turned off with the vehicle parked, the remaining capacity meter is switched off as well. When the storage battery needs charging with an insufficient power remaining and when the main switch is turned off, the need for charging may escape the driver's attention. The driver unintentionally skips a charging operation not knowing the consumed storage battery.

In the above described method in which charged battery capacity immediately after charging is determined using the regression equation from the terminal voltage, charge and discharge characteristics are different from battery to battery in terms of capacity and degree of aging. Therefore, tests should be beforehand conducted to collect characteristics data. Such extra job is time consuming.

SUMMARY OF THE INVENTION

In view of the above problems, the present invention has been developed. It is an object of the present invention to implement a wide range of ease-of-use design improvements in an electric vehicle by providing an electric vehicle power assist device which allows a running motor to be operative at an extremely slow speed in order to lighten manual power required when a driver manually walks the electric vehicle. This eliminates the possible risk of a vehicle sudden start that may be triggered when the driver manipulates erratically an accelerator while not being ready to start in his driving position. It also improves a lightweight electric vehicle power assist device that uses the running motor to drive a stand to its upright position with no dedicated stand motor employed; provides a remaining capacity insufficient alarm device that alerts the driver in an assured manner that the battery capacity is currently insufficient even while the main switch is turned off stopping the operation of all on-board devices, and by providing a battery charge capacity measuring device which determines accurately charge capacity by eliminating surface charge state upon a charging operation.

According to the first aspect of the present invention, the power assist device for use in an electric vehicle comprises a dismount sensor for sensing the driver's dismount action from the vehicle, a accelerator setting determining means for determining the closed state of the accelerator, speed mode setting means for putting the vehicle into an extremely slow speed mode when the driver dismounts and when the accelerator setting is in a closed state, and the speed limit means for setting the rotational speed of the running motor to be 1/n times smaller according to the extremely slow speed mode. Thus, when the driver walks the vehicle to park or start it, the running motor shifts to its extremely slow speed mode. The driver who dismounts and walks the vehicle manipulates the accelerator grip as necessary. In this case, the vehicle is run at the extremely slow speed by manipulating the accelerator in the same manner as in normal operation. Ease of use in manual running operation is substantially improved. Furthermore, since the maximum speed is limited to speeds as slow as human walking speeds, an erratic manipulation of the accelerator will not initiate a sudden start of the vehicle. Safety riding is thus assured.

When the mode of operation of the vehicle is shifted to the extremely slow speed mode, the vehicle speed set by the driver's manipulation of the accelerator is set to be 1/n times smaller than the corresponding speed in the normal mode. It means that if the driver turns the accelerator grip by the same angle, the effect of this turn is reduced to be 1/n times smaller in the extremely slow speed mode. The way the accelerator functions remains unchanged. Thus, manual running of the vehicle in power assistance using the running motor is performed in the same manner as in the normal running operation.

According to the second aspect of the present invention, the power assist device for use in an electric vehicle comprises sudden start restraint means for restraining motor driving until the accelerator is closed when the main switch is turned on with the accelerator in its opened state, a dismount sensor for sensing the driver's dismount action from the vehicle, accelerator setting determining means for determining the closed state of the accelerator, speed mode setting means for putting the vehicle into an extremely slow speed mode when the driver dismounts and when the accelerator setting is in a closed state, and the speed limit means for setting the rotational speed of the running motor to be 1/n times smaller according to the extremely slow speed mode. Even when the driver erratically turns on the main switch with the accelerator opened, the motor is restrained keeping the vehicle to a halt until the accelerator is closed. A sudden start of the vehicle is thus prevented. When the driver walks the vehicle in manual running, he is power assisted by the running motor.

According to the third aspect of the present invention in connection with the stand device for use in an electric vehicle, the pivoting shaft of the stand device idles while the running motor rotates in its forward direction, and is engaged with the output shaft of the running motor via the one-way clutch and the gear series while the running motor rotates in its reverse direction. The reverse rotary motion of the running motor is used to force the stand device to its upright position. No dedicated motor is required. The design of the vehicle is therefore simple, lightweight and low-cost.

According to the fourth aspect of the present invention, the remaining capacity insufficient alarm device for use in an electric vehicle comprises timer means for time counting in response to the turn-off operation of the main switch and prevention means for preventing at least the remaining capacity meter and the alarm means from stopping operating for time counting duration. When battery capacity measured by the remaining capacity meter indicates an insufficient capacity, the remaining capacity meter and the alarm means are left operating for a predetermined duration of time after the turn-off operation of the main switch. The alarm means continuously alerts the driver of an insufficient capacity. Thus, the alarm device prevents the fact of the insufficient capacity from escaping the driver's attention, and thus prevents the vehicle from being immobilized due to lack of power in the batteries in the middle of a run.

The remaining capacity meter thus presents the remaining capacity information, which in turn allows the driver to accurately predict a charging time required. This improves the ease of use of the electric vehicle.

According to the fifth aspect of the present invention in connection with the battery charge capacity measuring device for use in an electric vehicle, the post-charging terminal voltage, different from its normal terminal voltage, is measured at predetermined intervals for a predetermined duration of time after the completion of a charging operation, the presence of a surface charge state is determined from a variation in the measured terminal voltages, the surface charge state is eliminated by allowing the battery to discharge on a light load, and this determination/elimination process is repeated until the surface charge state is completely eliminated and reliable measured values are obtained. Thus, the surface charge state is eliminated in a short time and in a reliable manner. Furthermore, charge capacity is accurately determined.

The terminal voltage is measured with the surface charge state eliminated, and then the charge capacity of the batteries is determined. Thus, any regression equation that expresses rough estimate of the characteristics of the batteries is not required. The principle of this aspect of the invention can be applied to a diversity of storage batteries that suffer surface charge. The principle of this aspect of the present invention permits easy measurement and finds a wide range of applications. Even if the characteristics of the batteries are varied due to operating and ambient conditions, an accurate measurement of the charge capacity is performed because the capacity of the batteries are determined after the surface charge is eliminated.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts

FIG. 1 is a side view showing generally the electric motorcycle according to one embodiment of the electric vehicle of the present invention.

FIG. 2 is a cross-sectional view taken along the line II—II in FIG. 1.

FIG. 3 is a schematic diagram of one embodiment of the power assist device according to the first aspect of the electric vehicle of the present invention.

FIG. 4 is a flow chart of the control program of one embodiment of power assist device according to the second aspect of the electric vehicle of the present invention.

FIG. 5 is a graph illustrating the operation of the embodiment.

FIG. 6 is a diagrammatic perspective view of one embodiment of the stand device according to the third aspect of the electric vehicle of the present invention.

FIG. 7 is a plane view of the stand device of the electric vehicle of the above embodiment.

FIG. 8 is a side view of the stand device of the electric vehicle of the above embodiment.

FIG. 9 is a front view of the stand device of the electric vehicle of the above embodiment.

FIG. 10 is a schematic diagram showing generally a first embodiment of the fourth aspect of the electric vehicle of the present invention, in connection with the remaining capacity insufficient alarm device.

FIGS. 11A and 11B are a timing charts illustrating the operation of the timer circuit of the above embodiment.

FIG. 12 is a schematic diagram showing generally a second embodiment of the fourth aspect of the electric vehicle of the present invention, in connection with remaining capacity insufficient alarm device.

FIG. 13 is a flow chart of the control program of one embodiment of battery charge capacity measuring device according to the fifth aspect of the electric vehicle of the present invention.

FIG. 14 is a schematic diagram of a discharge circuit used in the battery charge capacity measuring device in the above embodiment.

FIG. 15 is a graph showing the discharge characteristics at constant current of a typical storage battery.

FIG. 16 is a graph showing the relationship between battery discharge current and discharge capacity.

FIG. 17 is a block diagram of the prior art battery bank and power supply circuit.

FIG. 18 is a perspective view showing the stand device of the prior art electric vehicle.

DESCRIPTION OF THE PREFERRED EMBODIMENTS

Referring now to FIGS. 1 through 12, the embodiments of the present invention are now discussed. The electric vehicle in each embodiment is illustrated using a two-wheel electric motorcycle (including an electric scooter) as an example. All the embodiments use the identical basic construction of the electric motorcycle.

As in the conventional internal-combustion-engine driven motorcycle, an electric scooter 1 in FIG. 1 has on the front and rear sides of a vehicle body 2, running wheels 4, 5 suspended by a body main frame 3 and a driver's seat 2a on the approximately middle position of the vehicle body 2. The front wheel 4 is steered by a handle 6. The rear wheel 5 is driven by a running electric motor 7 rather than by an engine. As shown in FIG. 2, a display panel 8 disposed in the middle of the handle 6 has an indicator device 9 for displaying a cruising speed, battery remaining capacity and the like and a plurality of switches for controlling on-board devices. Disposed below the display panel 8 on the main body 2 is the main switch for turning on or off all on-board devices.

The main frame 3 carries an electric power device 11 for supplying electric power required for running a motor 7 that converts electric power from the electric power device 11 into mechanical force, and a power transmission device 12 for transmitting the mechanical force to the rear wheel 5. Accelerator grip 6a, a brake lever, a brake mechanism, suspension systems and some other unshown components remain unchanged from those used in the conventional two-wheel motorcycle. A diversity of switches including the accelerator grip 6a, the brake lever, the main switch 10 and the like are electrically connected to the electric power device 11.

The electric power device 11 is made up of a battery bank section 14 disposed in an approximately middle lower position of the main frame 3 of the vehicle body 2, a remaining capacity meter 15, a power supply circuit 16, a control circuit 17, a charger 18 and a motor driving circuit 19 disposed beside the battery bank section 14, and a diversity of sensors disposed in the on-board devices.

The battery bank section 14 comprises four batteries 14a secured onto the main frame by brackets. These batteries 14a are connected in series by heavy wire gauge cables to avoid voltage drop and to obtain a required voltage. Electric power from the battery bank section 14 is regulated by the power supply circuit 16 before it is distributed to each of the on-board devices.

The motor driving circuit 19 is a circuit chiefly constructed of large-sized MOS FETs as high-power switching elements. Switching operation of the FET circuit in the form of chopper control raises or lowers the RMS voltage supplied to the running motor 7 to control the motor speed. Switching operation is performed according to speed instruction from the control circuit 17 in response to accelerator setting.

The control circuit 17 comprises a microcomputer 31 that receives signals from the accelerator grip 6a and sensors mounted in the on-board devices and outputs signals to the motor driving circuit 19 and the indicator device 9 on the display panel 8. The microcomputer 31 is provided with an A/D converter for converting an input signal into a digital signal, an I/O port, a CPU, and memory. Under the control of the program stored in the memory, the microcomputer 31 processes sensor signals including the one regarding accelerator setting set by the operation of the accelerator grip 6a, and signals from other sensors, and issues required instructions such as a duty setting signal to the motor driving circuit 19.

The power transmission device 12 is made up of the running motor 7 and a continuously variable transmission 20. The power transmission device 12 converts a rotary motion the motor 7 generates into an appropriate torque by means of the continuously variable transmission 20 and transmits the torque to the rear wheel 5.

When the driver turns on the main switch 10, the power supply circuit 16 starts to operate, distributing electric power from the battery bank section 14 to the on-board devices and making the vehicle ready to start. Next, when the driver operates the accelerator grip 6a, the control circuit 17 in response issues a speed instruction to the motor driving circuit 19. In response to the speed instruction, the motor driving circuit 19 raises or lowers the driving power fed to the running motor 7 to control the speed of the running motor 7. The rotary motion generated by the running motor 7 is converted into an appropriate torque which is then transmitted to the rear wheel 5. The two-wheel electric scooter 1 thus starts to run at a speed the driver desires.

Referring now to the embodiment in FIG. 3, the power assist device according to the first aspect of the electric vehicle of the present invention is now discussed. Sensing the driver's dismounting and the closed state of the accelerator set by the driver, the power assist device puts the vehicle into the extremely slow speed mode operation that controls the running motor at an extremely slow speed. The power assist device therefore performs safe power-assistance running at an extremely slow speed rotation of the running motor. When walking the vehicle, the driver can manipulate the accelerator in the same way he does in normal riding.

The power assist device of the electric vehicle of this embodiment is constructed of a power assist circuit 21 in FIG. 3. The power assist circuit 21 comprises an accelerator block 24, which, in response to the resistance of a potentiometer 22 that varies according to the manipulation of the accelerator grip 6a by the driver, converts a speed instruction voltage in response to the accelerator setting into a pulse signal by a comparator 32 to feed the pulse signal to the unshown motor driving circuit 19. A comparator 23 determines the closed state of the accelerator based on the speed instruction voltage signal, and a seat sensor block 25 senses the driver's dismounting from the vehicle. A flip-flop 26 reads a sensor signal from the seat sensor block 25 at the moment the accelerator shifts from its closed state to its opened state, and a photo-relay switch 27 is driven by the flip-flop 26. When the driver does not mount on the seat 2a at the moment the accelerator shifts from its closed state to its opened state, the flip-flop 26 causes the photo-relay switch 27 to conduct, thereby shorting a resistor 28 in the accelerator block 24. The speed instruction voltage signal is thus reduced to 1/n times its standard voltage, and the running motor 7 rotates at the extremely slow speed mode with its maximum speed limited below a threshold.

The seat sensor 29 as the dismount determining sensor in the seat sensor block 25 is mounted in the seat 2a, and is constructed of a pressure switch or a pressure sensor. When pressure on the seat sensor 29 is lightened, namely, when the driver is clear of the seat 2a, the sensor 29 gives a high-level sensor signal. The output terminal of the seat sensor 29 is connected to the data input terminal (hereinafter referred to as D terminal) of the flip-flop 26.

In this embodiment, as the dismount determining sensor for sensing the driver's dismounting, the seat sensor 29 in the form of the pressure switch or pressure sensor is mounted in the seat 2a. The present invention is not limited to this arrangement. Alternatively, the driver's dismounting may be determined by sensing a variation in the load of the vehicle. For example, a sensor that senses a variation in the load exerted on the suspension system may be employed. It is also perfectly acceptable to employ a combination of the seat sensor 29 and the load variation sensor.

The accelerator block 24 has the potentiometer 22, the resistance of which is varied in response to the manipulation of the accelerator grip 6a. As the accelerator setting increases, the potentiometer 22 decreases its resistance and the resulting speed instruction voltage increases. When the accelerator grip is closed, the speed instruction voltage drops down to a negative voltage below zero. The speed instruction voltage signal, which increases with the opening of the accelerator grip 6a, is thus output. The speed instruction voltage signal is fed to the comparator 32 for motor rotation control and the comparator 23 for determining the closed state of the accelerator.

The speed instruction voltage from the accelerator block 24 is fed to the positive terminal of the motor controlling comparator 32. The comparator 32 receives at its negative terminal a triangular pulse signal having a predetermined period from a triangular pulse generator circuit 33. The output terminal of the comparator 32 is connected to the unshown motor driving circuit 19. In response to the pulse output from the comparator 32, the motor driving circuit 19 controls the rotational speed of the running motor 7. Therefore, the duty ratio of the output pulse is varied in accordance with the accelerator setting. The rotational speed of the running motor is controlled in accordance with the duty ratio so that the vehicle's speed is controlled in response to the driver's manipulation of the accelerator.

The output line of the accelerator block 24 is also connected to the positive terminal of the comparator 23 that senses the closed state of the accelerator. The negative terminal of the comparator 23 is connected to zero volt commonline. When the accelerator is closed causing the potentiometer 22 to give a negative output, the comparator 23 determines that the accelerator is in a closed state and outputs a low-level signal. The output terminal of the comparator 23 is connected to the clock input terminal (hereinafter referred to as CK terminal) of the flip-flop 26. Thus, a signal indicative of the closed state of the accelerator is fed to the flip-flop 26.

The output terminal (hereinafter referred to as Q terminal) of the flip-flop 26 is connected to the photo-relay switch 27 via a resistor 30. When the output at the Q terminal of the flip-flop 26 is at a high level, the photo-relay switch 27 is designed to be conductive. The switching terminals of the photo-relay switch 27 are connected in parallel with the resistor 28 disposed forwardly of the potentiometer 22. When the photo-relay switch 27 is conductive or closed, the resistor 28 is shorted. The speed instruction voltage output by the accelerator block 24 is 1/n times smaller than the normal value. The running motor 7 rotates below a limitation and thus the speed of the vehicle is limited to a speed of human walk.

The D terminal of the flip-flop 26 is connected to the output terminal of the seat sensor block 25, and the CK terminal of the flip-flop 26 is connected to the output terminal of the accelerator block 24 via the comparator 23. When the driver opens the accelerator causing the output signal from the comparator 23 to shift from a low level to a high level and when the driver dismounts causing the seat sensor block 25 to output a high-level signal, the photo-relay switch 27 connected to the Q terminal of the flip-flop 26 is conducted thereby shorting the resistor 28.

The operation of the power assist device of the electric vehicle thus constructed is now discussed.

The driver closes the accelerator before dismounting the vehicle. The driver then possibly walks the vehicle from the stop position to the parking position. The seat sensor 29 in the seat sensor block 25 senses the driver's dismounting, and then the seat sensor block 25 outputs a high-level signal to the D terminal of the flip-flop 26. When the driver manipulates the accelerator grip 6a to put the accelerator to its opened state, the output of the comparator 23 is driven from low to high, and the corresponding pulse is entered to the CK terminal of the flip-flop 26. Since the flip-flop 26 has received the high-level signal from the seat sensor block 25, the flip-flop 26 outputs a high-level signal at its Q terminal causing the photo-relay switch 27 to be conductive. The vehicle then shifts to the extremely slow speed mode. Namely, the photo-relay switch 27 shorts the resistor 28. The speed instruction voltage from the accelerator block 24 is set to be 1/n times smaller than the normal value, and the vehicle speed is thus limited to a predetermined one as slow as human walking speeds.

The extremely slow speed mode operation thus starts. To walk the vehicle from the stop position to the parking position, the driver manipulates the accelerator in the same way as the normal riding to gain power assistance from the running motor 7. By changing the accelerator setting, the vehicle speed is adjusted. Since a speed limit as slow as walking speeds is established, the vehicle is prevented from making a sudden start in any setting of the accelerator.

To start the vehicle, the driver walks the vehicle from its parking position to its start position in power assistance and then mounts on the seat 2a with the vehicle at the start position and the extremely slow speed mode is terminated. Namely, the seat sensor block 25 outputs a low-level signal to the D terminal of the flip-flop 26. When the driver manipulates the accelerator grip 6a to open the accelerator, the output at the comparator 23 is driven from low to high, and the corresponding pulse is fed to the CK terminal of the flip-flop 26. Since the flip-flop 26 has already received the low-level signal from the seat sensor block 25, the flip-flop 26 outputs a low-level signal at its Q terminal. The photo-relay switch 27 is thus opened, terminating the shorting of the resistor 28. The vehicle is put into the normal running mode for normal running.

It is contemplated that the vehicle is designed to run backward at an extremely slow speed by incorporating a direction change switch that causes the running motor to rotate in the reverse direction in the extremely slow speed mode.

Thus, as described above when the driver walks the vehicle to park or start it, the running motor shifts to its extremely slow speed mode. The driver who dismounts and walks the vehicle manipulates the accelerator grip 6a as necessary. In this case, the vehicle is run at the extremely slow speed by manipulating the accelerator in the same manner as in normal operation. Ease of use in manual running operation is substantially improved. Furthermore, since the maximum speed is limited to speeds as slow as human walking speeds, an erratic manipulation of the accelerator will not initiate a sudden start of the vehicle. Safety riding is thus assured.

When the mode of operation of the vehicle is shifted to the extremely slow speed mode, the vehicle speed set by the driver's manipulation of the accelerator is set to be 1/n times smaller than the corresponding speed in the normal mode. It means that if the driver turns the accelerator grip 6a by the same angle, the effect of this turn is reduced to be 1/n times smaller in the extremely slow speed mode. The way the accelerator functions remains unchanged. Thus, manual running of the vehicle in power assistance using the running motor is performed in the same manner as in the normal running operation.

Referring to the embodiment in FIG. 4, the second aspect of the present invention is now discussed.

In addition to the advantage of the first aspect of the present invention, the power assist device of the electric vehicle in this embodiment prevents the vehicle from initiating a sudden start, regardless of whether the driver dismounts or mounts, by keeping the motor to a standstill until the accelerator has been once shifted to a closed state when the main switch is turned on with the accelerator erratically opened.

The power assist device of this embodiment comprises a seat sensor, as the dismount determining sensor, constructed of a contact switch disposed on a hinge portion of the seat, a control circuit connected to the seat sensor and a control program stored in the control circuit.

In this embodiment, the seat sensor is used as the dismount determining sensor. Alternatively, the present invention may employ an infrared sensor or an ultrasonic sensor that directly senses the presence of the driver.

To avoid its erratic sensing, the sensor may be set up to be active only when the vehicle stops or the sensor may be set up to issue a sensor signal only when the vehicle remains dismounted continuously for 3 seconds. The driver may be bumped on a rough road and is forced to be instantaneously detached from the seat. In such a case, the above arrangement prevents the sensor from erroneously determining that the driver dismounts.

The control program of the power assist device is discussed with reference to the flow chart in FIG. 4. In this flow chart, the control program is organized in three basic blocks: a first block (steps S1 through S4) for preventing a sudden start of the vehicle due to an erratic accelerator setting when the main switch is turned on, a second block (steps S5 and S6) for keeping the vehicle to a standstill until the accelerator is correctly opened, and a third block (step S7 and S8) for setting the motor operation mode according to the signal indicative of the driver's dismount/mount state from the seat sensor.

When the main switch is turned on, the power assist device begins to operate. The program or process goes to step 1, where the current accelerator setting or openness α is read. Next, the process goes step S2, where a determination is made of whether or not the accelerator setting α is 0. When it is not 0, the process goes to step S3 and step S4. When it is 0, the process goes to step S5.

At step S3, the accelerator setting α is read again, and the process goes to step S4. At step S4, a determination is made of whether or not the accelerator setting α is 0. When it is not 0, the process returns to S3. When it is 0, the process goes to step S5. Steps S3 and S4 are repeated unless the accelerator is closed for 0 accelerator setting. When the main switch is turned on with the accelerator already opened, the process repeatedly cycles through steps S3 and S4 until the accelerator is closed. This prevents a sudden start of the vehicle due to erratic accelerator setting. Namely, the process is unable to reach step S9 or S12, which sets a duty ratio. The running motor will not operate and the vehicle stays standstill.

At step S5, the accelerator setting α is read. At step S6, a determination is made of whether or not the accelerator setting α is greater than 0. When the accelerator setting α is 0, the process returns to step S5. When the accelerator setting α is greater than 0, the process goes to step S7. When the accelerator is closed, the process repeatedly cycles through S5 and S6 to make the vehicle to stand by until the accelerator is opened.

At step S7, the sensor signal from the seat sensor is read. At step S8, referring to the sensor signal, a determination is made of whether or not the driver mounts on the seat. When the sensor signal indicates that the driver mounts on the seat, the process goes to steps S9 through S11. Steps S9 through S11 control the motor in the normal running mode. When the sensor signal indicates that the driver dismounts, the process goes to steps S12 through S14. Steps S12 through S14 control the motor in the extremely slow speed mode.

When the driver mounts on the seat, the process goes to step S9. At step S9, the duty ratio D corresponding to the accelerator setting α is entered. Therefore, the vehicle speed is varied according to the duty ratio D which in turn is set according to the accelerator setting set by the driver.

At stop S10, the accelerator setting α is read. At step S11, a determination is made of whether or not the accelerator setting α is 0. When it is not 0, the process returns to step S9. When it is 0, the process returns to S5. Steps S9 through S11 are repeated until the accelerator setting α is 0. In the meantime, the motor is continuously controlled in the normal running mode. When the accelerator setting α is 0, namely, when the accelerator is closed, the process starts over with step S5.

When the driver dismounts, the process goes to step S12. At step S12, the duty ratio D corresponding to the accelerator setting α is set by 0.4 times smaller. As shown in FIG. 5, the duty ratio (chain double-dashed line) in the extremely slow speed mode is set to be 40% of the duty ratio (continuous line) in the normal running mode. The driver is thus freed from a critical manipulation of the accelerator to achieve a slow speed in the normal running mode to walk the vehicle. In the extremely slow speed mode, the driver allows the vehicle to move in power assistance by manipulating the accelerator as in the normal running mode.

At step S13, the accelerator setting α is read. At step S14, a determination is made of whether or not the accelerator setting α is 0. When it is not 0, the process returns to step S12. When it is 0, the process returns to S5. Steps S12 through S14 are repeated until the accelerator setting α is 0. In the meantime, the motor is controlled in the extremely slow speed mode. As in preceding steps S9 through S11, the process starts over with step S5 when the accelerator setting α is 0, namely when the accelerator is closed.

As described above, the power assist device for use in an electric vehicle of this embodiment includes the sudden start restraint means for restraining motor driving until the accelerator is closed when the main switch is turned on with the accelerator in its opened state. Even when the driver erratically turns on the main switch with the accelerator opened, the motor is restrained keeping the vehicle to a halt until the accelerator is closed. A sudden start of the vehicle is thus prevented. When the driver walks the vehicle in manual running, he is power assisted by the running motor.

When the mode of operation of the motor is shifted to the extremely slow speed mode, the vehicle speed according to the manipulation of the accelerator is reduced by a factor of 0.4, thus 40% of the vehicle speed of the normal running mode results. If the accelerator is manipulated in the same way as in the normal running mode, 40% of the vehicle speed is obtained. The driver thus can manipulate the accelerator to gain power assistance from the running motor as in the normal running mode.

The third aspect of the electric vehicle in connection with the stand device is now discussed with reference to the embodiment in FIGS. 6 through 9.

In this embodiment of the electric vehicle in connection with the stand device, the pivoting shaft of the main stand is engaged with the output shaft of the running motor via a one-way clutch and a series of gears. Taking advantage of the reverse rotary motion of the running motor dispenses with a dedicated motor for the stand device.

As shown in FIGS. 6 through 9, the stand device 41 in the embodiment of the electric vehicle comprises a gear box 42 integrally attached to the power transmission device 12 constructed of the running motor 7 and the continuously variable transmission 20, a one-way clutch 43 housed in the gear box 42, a series of gears 44, and a main stand 45, the rotation shaft of which is connected to the rotation shaft of the output gear of the series of gears 44.

The continuously variable transmission (CVT unit) 20 comprises a driving pulley 47 supported by the output shaft 7a of the motor 7, a driven pulley 48 rigidly supported by the rear wheel shaft 5a, and a V-shaped belt 49. By changing the radius of rotation of the driving pulley 47, the transmission ratio is variably changed to convert the rotary motion of the motor 7 into an appropriate torque, which is then transmitted to the rear wheel 5.

The one-way clutch 43 in the stand device 41 is supported by the output shaft 7a of the running motor 7. Attached onto the one-way clutch 43 is a first gear 51 which is the input gear of the series of gears 44. When the running motor 7 rotates in the forward direction (as shown by continuous line arrows in FIG. 8), namely, when the running motor 7 rotates to move the vehicle forward, the one-way clutch 43 idles, not transmitting the motor rotary motion to the series of gears 44. On the other hand, when the running motor 7 rotates in the reverse direction (dashed line arrows in FIG. 8), namely, when the running motor 7 rotates to move the vehicle backward, the one-way clutch 43 rotates integrally with the motor output shaft 7a to transmit the reverse rotary motion of the motor to the series of gears 44. At the same time, the one-way clutch 43 disengages the driving pulley 47 from the motor output shaft 7a, and thus reverse rotary motion is not transmitted to the rear wheel 5.

The series of gears 44 comprises the first gear 51 rigidly attached onto the one-way clutch 43, a second gear 52 meshed with the first gear 51, and a third gear 53 meshed with the second gear 52. Meshed gears have their own predetermined gear reduction ratios. The pivoting shaft 45a of the main stand 45 is rigidly attached to the shaft 53a of the third gear 53.

The stand 45 comprises the pivoting shaft 45a rigidly attached onto the third gear shaft 53a, a pair of feet 45b extending from both ends of the pivoting shaft 45a at substantially a right angle and gradually parted from each other toward their feet ends, and ground plates 45c attached onto the ends of the feet 45b. The stand 45 is constructed of mechanically strong material, and its tube portion has a large diameter so that it withstands the weight of the vehicle with a sufficient margin.

The stand 45 is provided with retracting compression springs 55. Each of the retracting springs 55 is connected at one end to the middle of each foot 45b, and at the other end to the gear box 42. The retracting springs 55 constantly bias the stand 45 toward its retraction position. When the reverse rotary motion of the running motor 7 is not transmitted, the stand 45 stays retracted.

The display panel 8 is provided with a stand upright switch, which is connected to the control circuit. When the stand upright switch is turned on, the control circuit issues an instruction that causes the motor to rotate in reverse, and then the stand 45 starts to shift to its upright position.

The stand 45 has on its upright position a limit switch 57 which is also connected to the control circuit. The limit switch 57 senses the stand 45 put into its upright position. The control circuit stops the reverse rotation of the running motor 7 and locks the stand 45.

The operation of the stand device 51 for the electric vehicle is now discussed. When the stand upright switch is turned on, the control circuit causes the running motor 7 to rotate in reverse. The one-way clutch 43 disengages the running motor 7 from the driving pulley 47 so that the reverse rotary motion of the running motor 7 is transmitted to the first gear 51 of the series of gears 44. The third gear 53 as the output gear of the gear series 44 rotates at a predetermined reduced speed. The stand 45 is pivoted around its own pivoting shaft 45a attached to the third gear shaft 53a in the direction of its upright position. With the stand 45 at its upright position as shown by imaginary lines in FIG. 8, it turns on the limit switch 57 and the control circuit stops the reverse rotation of the running motor 7. The stand 45 is locked, keeping the vehicle body 2 parked in a stable manner.

To move the two-wheeled vehicle from its upright stand position, push the vehicle forward slightly. Then, the stand 45 is reverted to its retraction position by elasticity of the retracting springs 55. The two wheeled vehicle is now ready start.

This embodiment employs the upright stand device in which the pivoting shaft of the stand is rotated to force the stand to its upright position. The present invention is not limited to this type of stand device. A raise/lower type stand device with its stand capable of moving up and down is also contemplated. The raise/lower stand device may employ a rotary/reciprocating motion conversion mechanism constructed of a combination of a rack and pinion and worm gears. In the upright type stand device, the vehicle is forward or backward moved slightly in the course of setting up the stand, and the vehicle may touch any object nearby, possibly damaging the rear light or some other thing. The raise/lower type stand device is free from such a damage, because it remains standstill in the course of setting up. By constructing the stand of planar plate rather than piping, the stand device may be used as an under guard.

As described above, according to this embodiment of the electric vehicle in connection with the stand device, the pivoting shaft of the stand device idles while the running motor rotates in its forward direction, and is engaged with the output shaft of the running motor via the one-way clutch and the gear series while the running motor rotates in its reverse direction. The reverse rotary motion of the running motor is used to force the stand device to its upright position. No dedicated motor is required. The design of the vehicle is therefore simple, light-weight and low-cost.

The fourth aspect of the electric vehicle in connection with the remaining capacity insufficient alarm device is now discussed with reference to the first embodiment in FIGS. 10 and 11.

The alarm device according to the first embodiment of the fourth aspect of the present invention keeps the remaining capacity meter and the alarm means operating for a predetermined duration of time after the turn-off operation of the main switch when battery capacity measured by the remaining capacity meter indicates an insufficient capacity. The alarm means alerts the driver of insufficient capacity to let the driver not to forget charging the battery.

As shown in FIG. 10, the alarm device comprises the power supply circuit 16 connected to the terminals of the battery bank section 14 having a plurality of storage batteries 14a, the 3-way main switch having SW 1, SW 2 and SW 3 for turning on or off the power supply circuit 16, the remaining capacity meter 15 connected to the power supply circuit 16 via a power line 62, a timer circuit 63 connected to the power line 62 via switching contacts SW 2 of the main switch, a buzzer circuit 64 connected to the power line 62 via switching contacts SW 3 of the main switch, an AND gate circuit 65 connected to the outputs of the remaining capacity meter 15 and the timer circuit 63, and a photo-relay switch 66 connected to the output of the AND gate circuit 65 for turning on or off the power supply circuit 16.

The main switch 10 is disposed below the display panel 8 as shown in FIG. 2. When the driver turns on the main switch 10, the power supply circuit 16 operates feeding power from the battery bank section 14 to all on-board devices in need so that the vehicle 1 is ready to start.

Returning to FIG. 10, the power supply circuit 16 is electrically connected to a variety of on-board devices via the power line 62. Therefore, the power supply circuit 16 feeds electric power to on-board devices via the power line 62 to allow them to operate.

The power line 62 of the power supply circuit 16 is also connected to the remaining capacity meter 15. When the power supply circuit 16 is turned on or off, the remaining capacity meter 15 is turned on or off as well. The remaining capacity meter 15 determines remaining capacity of the batteries by measuring the terminal voltage of the batteries and so on, and presents measured capacity remaining on the indicator device 9 on the display panel 8. The remaining capacity meter 15 of this embodiment issues at its output terminal a high-level signal when the remaining capacity of the batteries 14a drops below a threshold that needs charging. The setting of the threshold may be left to the user option. In this case, the batteries may be efficiently used taking into consideration a diversity of operating conditions.

To sense an insufficient capacity in the batteries, a conventional remaining capacity meter may replace the remaining capacity meter 15 of this embodiment that issues a high-level signal to indicate an insufficient capacity. Namely, a signal indicative of an insufficient capacity is picked from the signal lines for capacity presentation from the conventional remaining capacity meter. The signal may be input to the circuit of the present invention. For example, by connecting a comparator/inverter circuit having a comparator and an inverter to the above signal line, a low-level signal indicative of an insufficient capacity may be picked up and converted to a high-level signal, which may be used as an alarm signal.

The buzzer circuit 64 is connected via switching contacts SW 3 to the power line 62 that runs from the power supply circuit 16 to the remaining capacity meter 15. The timer circuit 63 is connected to the power line 62 directly and via switching contacts SW 2.

The output of the timer circuit 63 is connected to one of the inputs of the AND gate circuit 65. As shown in FIG. 11A, the timer circuit 63 is designed to provide a high-level signal when the timer circuit 63 receives power at its input from the power line 62. When the power line 62 is turned off, the timer circuit 63 continuously outputs the high-level signal for a predetermined duration of time after the turn-off of the power line 62. When the predetermined duration of time has elapsed, the timer circuit 63 stops issuing the high-level signal. If the high-level signal starts from the moment the power line 62 is turned off as shown in FIG. 11B, a slight delay may take place between the turn-off of the power line 62 and the rising edge of the high-level signal. Such a delay adversely affects the operation of the alarm device. In this embodiment, the high-level signal is fed to the AND gate circuit 65 as shown in FIG. 11A to assure that the alarm device of this embodiment operates reliably. Designated 63a is a pull-down resistor to regulate the supply voltage fed to the timer circuit 63.

The inputs of the AND gate circuit 65 are connected to the output terminals of the remaining capacity meter 15 and the timer circuit 63. The output of the AND gate circuit 65 is connected to the photo-relay switch 66 via an input current setting resistor 66a. The photo-relay switch 66 is connected in parallel with the switching contacts SW 1 of the main switch that turns on or off the power supply circuit 16.

Switching contacts SW 2 and SW 3 connected to the power line 62 are opened or closed in response to the opened or closed state of the switching contacts SW 1. When the switching contacts SW 1 are closed, the switching contacts SW 2 are closed and the switching contacts SW 3 are opened. When the switching contacts SW 1 are opened, the switching contacts SW 2 are opened and the switching contacts SW 3 are closed.

The operation of the alarm device of this embodiment is now discussed.

When the driver turns on the main switch in FIG. 10, the switching contacts SW 1 and SW 2 are closed, and the switching contacts SW 3 is opened. And, the timer circuit 63 issues the high-level signal.

The batteries are consumed as the two-wheeled electric vehicle 1 runs. When the remaining capacity of the batteries 14a drops below a threshold suggesting that a charging operation is required, the remaining capacity meter 15 issues a high-level signal alerting the driver of an insufficient capacity remaining in the batteries. The high-level signal from the timer circuit 63 and the high-level signal indicative of an insufficient capacity from the remaining capacity meter 15 are fed to the AND gate circuit 65. The AND gate circuit 65 outputs a high-level signal, thereby turning on the photo-relay switch 66.

When the two-wheeled electric vehicle 1 stops running and the driver turns off the main switch, the switching contacts SW 1 and SW 2 are opened, and the switching contacts SW 3 are closed. In response to the opened switching contacts SW 2, the timer circuit 63 operates, continuously giving the high-level signal for the predetermined duration of time. When the predetermined duration of time has elapsed, the high-level signal is terminated. For the predetermined duration of time set in the timer circuit 63, the photo-relay switch 66 is kept conductive, allowing the power supply circuit 16 to continuously operate. The devices connected to the power supply circuit 16 are thus continuously powered.

The switching contacts SW 3 are closed allowing the buzzer circuit 64 to give off an alarm buzzer sound. In this case, the remaining capacity meter 15 remains continuously operative, and the driver can monitor the remaining capacity and estimate how long he needs to complete charging.

During the predetermined duration set by the timer circuit 63, the alarm buzzer sound is continuously given. At the end of the predetermined duration, both the alarm buzzer sound and the remaining capacity display are terminated. Namely, after the predetermined duration of time, the high-level signal from the timer circuit. 63 is terminated. The output signal from the AND gate 65 is driven low, turning off the photo-relay switch 66. The photo-relay switch 66 in turn turns off the power supply circuit 16, subsequently deactivating the remaining capacity meter 15 and the buzzer circuit 64.

When the remaining capacity in the batteries is sufficient, the remaining capacity meter 15 gives no high-level signal, and thus no alarm buzzer sound is provided. Namely, when the batteries have sufficient capacity, the remaining capacity meter 15 gives a low-level signal, which causes the AND gate circuit 65 to keep its output signal at a low-level regardless of the output signal from the timer circuit 63. Thus, the photo-relay switch 66 is turned off. When the driver turns off the main switch, the switching contacts SW 1 are opened with the photo-relay switch 66 remaining off.

The power supply circuit 16 is thus turned off, causing the remaining capacity meter 15 and the buzzer circuit 64 to be switched off.

In this embodiment, the alarm buzzer sound is used as the alarm means to alert the driver. The present invention is not limited to this type of alarm means. Alternatively, a speech synthesizing circuit for voicing an alarm message may be used. This message may tell clearly that the battery capacity is now insufficient and prompts the driver to charge the batteries. Alternatively, the buzzer circuit may be dispensed with, and instead, the conventional display panel as the indicator circuit for remaining capacity presentation may be modified. In this case, the remaining capacity display may be flashed or presented in a different color, or both in combination to alert the driver.

In the above embodiment, the present invention is applied to the alarm device that alerts the driver of the battery remaining capacity. The present invention is not limited to this, but may be applied to some other protection devices that possibly sense overheating, overvoltage, voltage drop and the like in the electric vehicle. Protection devices to sense these anomalies alert the driver and help assure safe riding on the electric vehicle.

As described above, the remaining capacity insufficient alarm device comprises timer means for time counting in response to the turn-off operation of the main switch and prevention means for preventing at least the remaining capacity meter and the alarm means from stopping operating for time counting duration. When battery capacity measured by the remaining capacity meter indicates an insufficient capacity, the remaining capacity meter and the alarm means are left operating for a predetermined duration of time after the turn-off operation of the main switch. The alarm means continuously alerts the driver of an insufficient capacity. Thus, the alarm device prevents the fact of the insufficient capacity from escaping the driver's attention, and thus prevents the vehicle from being immobilized due to lack of power in the batteries in the middle of a run.

The remaining capacity meter thus presents the remaining capacity information, which in turn allows the driver to accurately predict a charging time required. This improves the ease of use of the electric vehicle.

The alarm device according to the second embodiment of the fourth aspect of the present invention is now discussed referring to FIG. 12.

As shown in FIG. 12, the alarm device in the second embodiment of the fourth aspect of the present invention is basically identical to the first embodiment in structure. In the second embodiment, the switching contacts SW 3 are dispensed with and the circuit configuration of the buzzer circuit 64 is modified. An AND gate circuit 67 is disposed at the input of the buzzer circuit 64 to turn on or off it. The inputs of the AND gate circuit 67 are connected to the switching contacts SW 2 of the main switch and the output of the AND gate circuit 65.

One input of the AND gate circuit 67 is connected via an inverter 68 to the junction of the switching contacts SW 2 of the main switch and the timer circuit 63. When the junction is driven low, the inverter 68 inputs a high-level signal to the AND gate circuit 67. The other input of the AND gate circuit 67 is connected to the junction of the output of the AND gate circuit 65 and the resistor 66a. The output signal from the AND gate circuit 65 is input to the AND gate circuit 67. The output of the AND gate circuit 67 is connected to the buzzer circuit 64, which triggers the buzzer alarm sound in response to the high-level signal from the AND gate circuit 67.

The operation of the alarm device of this embodiment is now discussed.

When the driver turns on the main switch in FIG. 12, both switching contacts SW 1 and SW 2 are closed, causing the timer circuit 63 to output a high-level signal.

The batteries are consumed as the two-wheeled electric vehicle 1 runs. When the remaining capacity of the batteries 14a drops below a threshold suggesting that a charging operation is required, the remaining capacity meter 15 issues a high-level signal alerting the driver of an insufficient capacity remaining in the batteries. The high-level signal from the timer circuit 63 and the high-level signal indicative of an insufficient capacity from the remaining capacity meter 15 are fed to the AND gate circuit 65. The AND gate circuit 65 outputs a high-level signal, thereby turning on the photo-relay switch 66.

When the two-wheeled electric vehicle 1 stops running and the driver turns off the main switch, the switching contacts SW 1 and SW 2 are opened. In response to the opened switching contacts SW 2, a low-level signal is fed to the timer circuit 63. For a predetermined duration of time from the moment the low-level signal is fed, the timer circuit 63 outputs a high-level signal continuously. At the end of the duration, the output of the high-level signal is terminated. For the predetermined duration of time set in advance in the timer circuit 63, the photo-relay switch 66 allows the power supply circuit 16 to operate and the devices connected to the power supply circuit 16 are thus continuously powered.

The low-level signal fed to the timer circuit 63 is inverted by the inverter 68 into a high-level signal, which is then fed to the AND gate circuit 67. The high-level from the inverter 68 and another high-level signal from the AND gate circuit 65 cause the AND gate circuit 67 to give a high-level signal, which is then fed to the buzzer circuit 64. The buzzer circuit 64 gives off an alarm buzzer sound. In this case, the remaining capacity meter 15 continuously operates. The driver can thus monitor the remaining capacity of the batteries and estimate the charging time required.

During the predetermined duration set by the timer circuit 63, the alarm buzzer sound is continuously given. At the end of the predetermined duration, both the alarm buzzer sound and the remaining capacity display are terminated. Namely, after the predetermined duration of time, the high-level signal from the timer circuit 63 is terminated. The output signal from the AND gate 65 is driven low, turning off the photo-relay switch 66. The photo-relay switch 66 in turn turns off the power supply circuit 16, subsequently deactivating the remaining capacity meter 15 and the buzzer circuit 64.

When the remaining capacity in the batteries is sufficient, the remaining capacity meter 15 gives no high-level signal, and thus no alarm buzzer sound is provided. Namely, when the batteries have sufficient capacity, the remaining capacity meter 15 glares a low-level signal, which causes the AND gate circuit 65 to keep its output signal at a low-level regardless of the output signal from the timer circuit 63. Thus, the photo-relay switch 66 is turned off. When the driver turns off the main switch, the switching contacts SW 1 are opened with the photo-relay switch 66 remaining off. The power supply circuit 16 is thus turned off, causing the remaining capacity meter 15 and the buzzer circuit 64 to be switched off.

As described above, the second embodiment of the fourth aspect of the present invention offers the same advantage as the first embodiment. Furthermore, the second embodiment employs the main switch having a smaller number of mechanical switching contacts. Faults attributed to these contacts are thus eliminated and thus the reliability of the system is increased.

Next, the battery charge capacity measuring device of the electric vehicle according to the fifth aspect of the present invention is discussed referring to FIGS. 13 and 14.

The charge capacity measuring device eliminates the surface charge that indicates a voltage different from the normal terminal voltage, for a predetermined duration of time after a charging operation is completed, and allows the correct capacity of the batteries to be measured. Namely, the batteries are charged with a charging voltage that is higher than the terminal voltage, the terminal voltage is measured at predetermined intervals after the charging operation is completed, and, if any variation between measured voltages is detected, a light load discharging is performed on the assumption that the batteries are in a surface charge state. This cycle is repeated until a stable voltage free from surface charge state is measured. When the surface charge state is eliminated, charge capacity is determined based on the measured voltage.

The charge capacity measuring device comprises the battery bank section having the plurality of storage batteries, the remaining capacity meter for determining capacity from the open-circuit voltage of the battery bank section, and the control circuit connected to the remaining capacity meter. The charge capacity measuring device further comprises a discharge circuit 71 shown in FIG. 14 and a charge capacity measuring program that controls the operation of the discharge circuit 71 and the remaining capacity meter. The charge capacity measuring program uses the remaining capacity meter to determine whether or not the batteries are in a surface charge state. The program uses the discharge circuit 71 to eliminate the surface charge state, and uses the remaining capacity meter to determine the current charge capacity.

The operation program of the charge capacity measuring device is discussed referring to the flow chart in FIG. 13. In the flow chart in FIG. 13, the program for measuring charge capacity is organized in three main blocks: a first block (steps S1 through S4) for determining whether or not the batteries are in a state of surface charge, a second block (steps S5 through S7), in succession to the first block, for eliminating the surface charge by discharging the batteries on a light load when the batteries are found to be in a surface charge state, and a third block (step S8) for determining the charge capacity based on a stable terminal voltage after the surface charge is eliminated.

At step S1, the terminal voltage is measured with the battery bank section in an open-circuit, no-load state. The measured value E1 is stored in memory means. At step S2, a predetermined duration Δt1 is time counted. When the predetermined duration Δt1 has elapsed, the process goes to step S3. At step S3, the terminal voltage is measured with no load on the batteries. The measured value E2 is stored in the memory means.

At step S4, a determination is made of whether or not the batteries are in a surface charge state by comparing E1 and E2. Specifically, measured value E2 is subtracted from measured value E1, and the difference therebetween is then compared with ΔE that is error-compensated. When the difference is greater than ΔE, namely, when the terminal voltage suffers a variation greater than a predetermined rate of reduction even after the predetermined duration of Δt1, the batteries are found to be still in a surface charge state and not in equilibrium. On the other hand, when the difference is smaller, namely, when the terminal voltage indicates a marginal variation after the predetermined duration of Δt1, the batteries are thought to be in equilibrium with the surface charge state eliminated.

When step S4 determines that the surface charge state presents, the process starts over with step S1 after a sequence of steps (steps S5 through S7) for eliminating the surface charge. A cycle of S1 through S7 is repeated until the surface charge is eliminated. When the surface charge is eliminated, the process goes to step S8, where the charge capacity of the batteries is determined.

The block for eliminating the surface charge includes discharging the batteries on a light load for a duration to remove charge in the vicinity of the terminals of the batteries in order to eliminate the surface charge state.

A discharge process is performed using the discharge circuit 71 in FIG. 14. The discharge circuit 71 comprises a semiconductor switching device 72 and a resister 73 having a predetermined high resistance connected in a series connection. This series connection is connected in parallel with the output terminals of the battery bank section 14 having a plurality of batteries 14a. The switching operation of the switching device 72 allows the resistor 73 to discharge the batteries for a predetermined duration of time of Δt2.

At step S5, the switching device 72 is turned on, and the battery bank section 14 starts discharging through the high resistor 73 by a small current I. At step S6, the predetermined duration of Δt2 is counted. When the predetermined duration of Δt2 has elapsed, the switching device 72 is turned off at step S7. The discharging of the storage batteries 14a is terminated. The process starts over with step S1 again. A sequence of steps for the determination of the surface charge and elimination of the surface charge (steps S1 through S7) is repeated until the surface charge state is eliminated.

When the surface charge state is eliminated through the process of the determination and then elimination of the surface charge, the charge capacity of the batteries is finally determined at step S8. The measured open-circuit voltage E2 is thought of as a stable voltage with the batteries at equilibrium. The remaining capacity meter thus determines the charge capacity of the batteries from the measured value E2.

As described above, according to the battery charge capacity measuring device of this embodiment, the post-charging terminal voltage, different from its normal terminal voltage, is measured at predetermined time intervals for a predetermined duration of time after the completion of a charging operation, the presence of a surface charge state is determined from a variation in the measured terminal voltages, the surface charge state is eliminated by allowing the battery to discharge on a light load, and this determination/elimination process is repeated until the surface charge state is completely eliminated and reliable measured values are obtained. Thus, the surface charge state is eliminated in a short time and in a reliable manner. Furthermore, charge capacity is accurately determined.

The terminal voltage is measured with the surface charge state eliminated, and then the charge capacity of the batteries is determined. Thus, any regression equation that expresses rough estimate of the characteristics of the batteries is not required. The principle of this aspect of the invention can be applied to a diversity of storage batteries that suffer surface charge. The principle of this aspect of the present invention permits easy measurement and finds a wide range of applications. Even if the characteristics of the batteries are varied due to operating and ambient conditions, an accurate measurement of the charge capacity is performed because the capacity of the batteries are determined after the surface charge is eliminated.

As described above, the present invention provides an improved easy-to-operate feature in a wide range of operation of an electric vehicle. According to the electric vehicle of the present invention, there is provided an electric vehicle power assist device which allows a running motor to be operative at an extremely slow speed in order to lighten manual power required when a driver manually walks the electric vehicle. There is also provided an electric vehicle power assist device which eliminates the possible risk of a vehicle sudden start that may be triggered when the driver manipulates erratically an accelerator while not being ready to start in his driving position. There is also provided a lightweight electric vehicle power assist device that uses the running motor to drive a stand to its upright position with no dedicated stand motor employed. There is also provided a remaining capacity insufficient alarm device that alerts the driver in an assured manner that the battery capacity is currently insufficient even while the main switch for stopping the operation of all on-board devices is turned off. There is also provided a battery charge capacity measuring device which determines accurately charge capacity by eliminating surface charge state upon a charging operation.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A power assist device for use in a vehicle which includes an accelerator, a running motor, and a motor driving circuit for controlling the rotation of the motor in response to the setting of the accelerator, the power assist device comprising:

a dismount sensor for sensing a driver's dismount action from the vehicle and outputting a dismount signal after the driver dismounts the vehicle;

accelerator setting determining means for determining whether the accelerator is in a closed state and outputting an accelerator closed state signal when the accelerator is in the closed state;

speed mode setting means for setting the vehicle into an extremely slow speed mode when the driver dismounts the vehicle and when the accelerator setting is in a closed state, in response to the dismount signal from the dismount sensor and the accelerator closed state signal; and speed limit means for setting the rotational speed of the running motor in the extremely slow speed mode to be smaller than a normal value in a normal mode of the vehicle.

2. The power assist device of claim 1, wherein the rotational speed of the running motor in the extremely slow speed mode is 1/n times smaller than the normal value in the normal mode of the vehicle, where n is a positive number.

3. A power assist device for use in a vehicle which includes a main switch, an accelerator, a running motor, and a motor driving circuit for controlling the rotation of the motor in response to the setting of the accelerator, the power assist device comprising:

sudden start restraint means for, when the main switch is turned on with the accelerator in an opened state, restraining motor driving until the accelerator is closed;

a dismount sensor for sensing a driver's dismount action from the vehicle and outputting a dismount signal after the driver dismounts the vehicle;

accelerator setting determining means for determining whether the accelerator is in a closed state and outputting an accelerator closed state signal when the accelerator is in the closed state;

speed mode setting means for setting the vehicle into an extremely slow speed mode when the driver dismounts the vehicle and when the accelerator setting is in a closed state, in response to the dismount signal from the dismount sensor and the accelerator closed state signal; and speed limit means for setting the rotational speed of the running motor in the extremely slow speed mode to be smaller than a normal value in a normal mode of the vehicle.

4. The power assist device of claim 3, wherein the rotational speed of the running motor in the extremely slow speed mode is 1/n times smaller than the normal value in the normal mode of the vehicle, where n is a positive number.

5. An electric vehicle, comprising:

an accelerator;

a running motor;

a motor driving circuit for controlling the rotation of the motor in response to the setting of the accelerator; and a power assist device comprising:

a dismount sensor for sensing a driver's dismount action from the vehicle and outputting a dismount signal after the driver dismounts the vehicle;

accelerator setting determining means for determining whether the accelerator is in a closed state and outputting an accelerator closed state signal when the accelerator is in the closed state;

speed mode setting means for setting the vehicle into an extremely slow speed mode when the driver dismounts the vehicle and when the accelerator setting is in a closed state, in response to the dismount signal from the dismount sensor and the accelerator closed state signal; and speed limit means for setting the rotational speed of the running motor in the extremely slow speed mode to be smaller than a normal value in a normal mode of the vehicle.

6. The electric vehicle of claim 5, further comprising a main switch for turning on and off the vehicle and wherein the power assist device further includes sudden start restraint means for, when the main switch is turned on with the accelerator in an opened state, restraining motor driving until the accelerator is closed.

7. The electric vehicle of claim 5, further comprising:

at least two wheels;

power transmission means for transmitting motor output power to at least one of the two wheels; and a stand device for parking the vehicle, the stand device comprising:

retractable stand means for parking the vehicle when the retractable stand means is in a parking position, the retractable stand means being in a retracted position when the vehicle is not parked;

clutch means for disengaging motor output power with the power transmission means and for engaging motor output power with the stand means, when the motor rotates in a reverse direction, so as to cause the stand means in the parking position to park the vehicle;

wherein when the motor rotates in a forward direction to move the vehicle forwardly, the clutch means disengages motor output power with the stand means to allow the stand means to be in the retracted position and engages motor output power with the power transmission means.

8. The electric vehicle of claim 7 wherein the stand means of the stand device includes a pivoting shaft for engaging and disengaging with the motor output power, and the clutch means includes a one-way clutch and a series of gears for engaging and disengaging the pivoting shaft of the stand means with the motor output power.

9. The electric vehicle of claim 5, further comprising:
a storage battery supplying electric power to operate the motor;
a power supply circuit for feeding electric power from the storage battery to a plurality of devices on the vehicle;
a main switch for turning on and off the power supply circuit; and
a remaining capacity insufficient alarm device comprising:
means for measuring the remaining capacity of the storage battery and for issuing an alarm signal when the storage battery has an insufficient capacity;
alarm means for alerting a driver of insufficient capacity;
timer means for counting time for a predetermined duration of time in response to the turn-off operation of the main switch and for continuously issuing an activation signal for the predetermined duration of time after the turn-off operation of the main switch; and prevention means, responsive to the activation signal from the timer means, for preventing the power supply circuit from cutting off power to, at least, the remaining capacity measuring means and the alarm means, whereby the alarming means and the remaining capacity measuring means remain operative for the predetermined duration of time after the turn-off operation of the main switch, so that the driver is alerted by the remaining capacity measuring means and the alarm means when the storage battery has an insufficient capacity.

10. The electric vehicle of claim 5, further comprising a storage battery supplying electric power to operate the motor, and a storage battery charge capacity measuring comprising:
determining means for, upon completion of a charging operation, measuring the terminal voltage across the storage battery at predetermined time intervals and determining whether the storage battery is in a surface charge state based on a variation in the terminal voltages measured at the predetermined time intervals;
surface charge eliminating means for allowing the storage battery to discharge on a light load when the storage battery is in a surface charge state; and
capacity determining means for determining charge capacity based on the terminal voltage after the surface charge state is eliminated.

11. The electric vehicle of claim 5, wherein the rotational speed of the running motor in the extremely slow speed mode is 1/n times smaller than the normal value in the normal mode of the vehicle, where n is a positive number.

* * * * *

UNITED STATES PATENT AND TRADEMARK OFFICE
CERTIFICATE OF CORRECTION

PATENT NO.    : 5,730,243
DATED         : March 24, 1998
INVENTOR(S)   : Yoshikazu Koike, et al.

It is certified that an error appears in the above identified patent and that said Letters Patent is hereby corrected as shown below:

Title page, item 30, Foreign Application Priority Data, change "Jan. 30, 1996" to --Jan. 30, 1995--.

Signed and Sealed this

Twenty-seventh Day of October, 1998

*Attest:*

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO.    : 5,730,243
DATED         : March 24, 1998
INVENTOR(S)   : Yoshikazu Koike, et al.

It is certified that an error appears in the above identified patent and that said Letters Patent is hereby corrected as shown below:

Title page: Item [73] , Assignee, insert --Tokyo R&D Co., Ltd., both of--.

Signed and Sealed this

Fourteenth Day of September, 1999

Attest:

Q. TODD DICKINSON

*Attesting Officer*        *Acting Commissioner of Patents and Trademarks*